United States Patent
Mignard

(10) Patent No.: US 7,773,286 B2
(45) Date of Patent: Aug. 10, 2010

(54) PERIODIC DIMPLE ARRAY

(75) Inventor: Marc Maurice Mignard, San Jose, CA (US)

(73) Assignee: QUALCOMM MEMS Technologies, Inc., San Diego, CA (US)

( * ) Notice: Subject to any disclaimer, the term of this patent is extended or adjusted under 35 U.S.C. 154(b) by 0 days.

(21) Appl. No.: 11/949,612

(22) Filed: Dec. 3, 2007

(65) Prior Publication Data

US 2009/0073539 A1 Mar. 19, 2009

Related U.S. Application Data

(60) Provisional application No. 60/972,715, filed on Sep. 14, 2007.

(51) Int. Cl.
*G02B 26/00* (2006.01)

(52) U.S. Cl. .................. 359/291; 359/290

(58) Field of Classification Search ............ 359/247, 359/223, 290, 291, 318, 223.1
See application file for complete search history.

(56) References Cited

U.S. PATENT DOCUMENTS

| | | |
|---|---|---|
| 3,728,030 A | 4/1973 | Hawes |
| 3,955,190 A | 5/1976 | Teraishi |
| 4,403,248 A | 9/1983 | te Velde |
| 4,441,791 A | 4/1984 | Hornbeck |
| 4,560,435 A | 12/1985 | Brown et al. |
| 4,655,554 A | 4/1987 | Armitage |
| 4,786,128 A | 11/1988 | Birnbach |
| 4,859,060 A | 8/1989 | Katagiri et al. |
| 4,954,789 A | 9/1990 | Sampsell |
| 4,956,619 A | 9/1990 | Hornbeck |
| 4,982,184 A | 1/1991 | Kirkwood |
| 5,022,745 A | 6/1991 | Zahowski et al. |
| 5,028,939 A | 7/1991 | Hornbeck et al. |
| 5,062,689 A | 11/1991 | Koehler |
| 5,091,983 A | 2/1992 | Lukosz |

(Continued)

FOREIGN PATENT DOCUMENTS

EP  0 599 375  6/1994

(Continued)

OTHER PUBLICATIONS

Feenstra et al., Electrowetting displays, Liquivista BV, 16 pp., Jan. 2006.

(Continued)

*Primary Examiner*—William C Choi
(74) *Attorney, Agent, or Firm*—Knobbe Martens Olson & Bear LLP

(57) ABSTRACT

A microelectromechanical (MEMS) device includes a substrate, an actuation electrode over the substrate, a reflective layer over the actuation electrode, and a support layer between the actuation electrode and the reflective layer. The reflective layer includes at least one aperture through the reflective layer. The support layer includes a recess between the actuation electrode and the at least one aperture. Upon application of a control signal to the device, at least a first portion of the reflective layer is configured to move into the recess and at least a second portion of the reflective layer is configured to remain stationary. The reflectivity of the MEMS device is dominantly modulated by changing a phase difference between light reflected from the first portion and light reflected from the second portion.

37 Claims, 22 Drawing Sheets

U.S. PATENT DOCUMENTS

| | | | |
|---|---|---|---|
| 5,096,279 | A | 3/1992 | Hornbeck et al. |
| 5,170,283 | A | 12/1992 | O'Brien et al. |
| 5,315,370 | A | 5/1994 | Bulow |
| 5,381,232 | A | 1/1995 | Van Wijk |
| 5,452,138 | A | 9/1995 | Mignardi et al. |
| 5,471,341 | A | 11/1995 | Warde et al. |
| 5,526,172 | A | 6/1996 | Kanack |
| 5,559,358 | A | 9/1996 | Burns et al. |
| 5,561,523 | A | 10/1996 | Blomberg et al. |
| 5,636,052 | A | 6/1997 | Arney et al. |
| 5,646,729 | A | 7/1997 | Koskinen et al. |
| 5,646,768 | A | 7/1997 | Kaeiyama |
| 5,661,592 | A | 8/1997 | Bornstein et al. |
| 5,665,997 | A | 9/1997 | Weaver et al. |
| 5,710,656 | A | 1/1998 | Goossen |
| 5,719,068 | A | 2/1998 | Suzawa et al. |
| 5,734,177 | A | 3/1998 | Sakamoto |
| 5,786,927 | A | 7/1998 | Greywall |
| 5,808,781 | A | 9/1998 | Arney et al. |
| 5,818,095 | A | 10/1998 | Sampsell |
| 5,825,528 | A | 10/1998 | Goossen |
| 5,838,484 | A | 11/1998 | Goossen et al. |
| 5,867,302 | A | 2/1999 | Fleming |
| 5,914,804 | A | 6/1999 | Goossen |
| 5,920,418 | A | 7/1999 | Shiono et al. |
| 5,961,848 | A | 10/1999 | Jacquet et al. |
| 6,028,689 | A | 2/2000 | Michalicek et al. |
| 6,040,937 | A | 3/2000 | Miles |
| 6,046,659 | A | 4/2000 | Loo et al. |
| 6,055,090 | A | 4/2000 | Miles |
| 6,100,861 | A | 8/2000 | Cohen et al. |
| 6,215,579 | B1 * | 4/2001 | Bloom et al. ............... 359/298 |
| 6,242,932 | B1 | 6/2001 | Hembree |
| 6,262,697 | B1 | 7/2001 | Stephenson |
| 6,327,071 | B1 | 12/2001 | Kimura |
| 6,356,378 | B1 | 3/2002 | Huibers |
| 6,384,952 | B1 | 5/2002 | Clark et al. |
| 6,433,917 | B1 | 8/2002 | Mei et al. |
| 6,438,282 | B1 | 8/2002 | Takeda et al. |
| 6,452,712 | B2 | 9/2002 | Atobe et al. |
| 6,466,354 | B1 | 10/2002 | Gudeman |
| 6,556,338 | B2 | 4/2003 | Han et al. |
| 6,574,033 | B1 | 6/2003 | Chui et al. |
| 6,597,490 | B2 | 7/2003 | Tayebati |
| 6,608,268 | B1 | 8/2003 | Goldsmith |
| 6,632,698 | B2 | 10/2003 | Ives |
| 6,650,455 | B2 | 11/2003 | Miles |
| 6,657,832 | B2 | 12/2003 | Williams et al. |
| 6,661,561 | B2 | 12/2003 | Fitzpatrick et al. |
| 6,674,562 | B1 | 1/2004 | Miles et al. |
| 6,680,792 | B2 | 1/2004 | Miles |
| 6,698,295 | B1 | 3/2004 | Sherrer |
| 6,710,908 | B2 | 3/2004 | Miles et al. |
| 6,794,119 | B2 | 9/2004 | Miles |
| 6,813,059 | B2 | 11/2004 | Hunter et al. |
| 6,841,081 | B2 | 1/2005 | Chang et al. |
| 6,844,959 | B2 | 1/2005 | Huibers et al. |
| 6,867,896 | B2 | 3/2005 | Miles |
| 6,870,654 | B2 | 3/2005 | Lin et al. |
| 6,882,458 | B2 | 4/2005 | Lin et al. |
| 6,882,461 | B1 | 4/2005 | Tsai et al. |
| 6,912,022 | B2 | 6/2005 | Lin et al. |
| 6,940,630 | B2 | 9/2005 | Xie |
| 6,947,200 | B2 | 9/2005 | Huibers |
| 6,952,303 | B2 | 10/2005 | Lin et al. |
| 6,958,847 | B2 | 10/2005 | Lin |
| 6,980,350 | B2 | 12/2005 | Hung et al. |
| 6,982,820 | B2 | 1/2006 | Tsai |
| 7,006,272 | B2 | 2/2006 | Tsai |
| 7,027,204 | B2 * | 4/2006 | Trisnadi et al. ............. 359/291 |
| 7,034,981 | B2 | 4/2006 | Makigaki |
| 7,046,422 | B2 | 5/2006 | Kimura et al. |
| 7,119,945 | B2 | 10/2006 | Kothari et al. |
| 7,123,216 | B1 | 10/2006 | Miles |
| 7,126,738 | B2 | 10/2006 | Miles |
| 7,130,104 | B2 | 10/2006 | Cummings |
| 7,184,195 | B2 | 2/2007 | Yang |
| 7,184,202 | B2 | 2/2007 | Miles et al. |
| 7,198,973 | B2 | 4/2007 | Lin et al. |
| 7,221,495 | B2 | 5/2007 | Miles et al. |
| 7,236,284 | B2 | 6/2007 | Miles |
| 7,245,285 | B2 | 7/2007 | Yeh et al. |
| 7,321,457 | B2 | 1/2008 | Heald |
| 7,372,613 | B2 | 5/2008 | Chui et al. |
| 7,372,619 | B2 | 5/2008 | Miles |
| 7,385,744 | B2 | 6/2008 | Kogut et al. |
| 7,385,762 | B2 | 6/2008 | Cummings |
| 7,400,488 | B2 | 7/2008 | Lynch et al. |
| 7,629,197 | B2 | 12/2009 | Luo et al. |
| 2001/0003487 | A1 | 6/2001 | Miles |
| 2001/0028503 | A1 | 10/2001 | Flanders et al. |
| 2001/0043171 | A1 | 11/2001 | Van Gorkom et al. |
| 2002/0015215 | A1 | 2/2002 | Miles |
| 2002/0024711 | A1 | 2/2002 | Miles |
| 2002/0054424 | A1 | 5/2002 | Miles |
| 2002/0070931 | A1 | 6/2002 | Ishikawa |
| 2002/0075555 | A1 | 6/2002 | Miles |
| 2002/0126364 | A1 | 9/2002 | Miles |
| 2002/0146200 | A1 | 10/2002 | Kurdle et al. |
| 2002/0149828 | A1 | 10/2002 | Miles |
| 2003/0016428 | A1 | 1/2003 | Kato et al. |
| 2003/0035196 | A1 | 2/2003 | Walker |
| 2003/0043157 | A1 | 3/2003 | Miles |
| 2003/0053078 | A1 | 3/2003 | Missey et al. |
| 2003/0072070 | A1 | 4/2003 | Miles |
| 2003/0202265 | A1 | 10/2003 | Reboa et al. |
| 2003/0202266 | A1 | 10/2003 | Ring et al. |
| 2004/0008396 | A1 | 1/2004 | Stappaerts |
| 2004/0008438 | A1 | 1/2004 | Sato |
| 2004/0027671 | A1 | 2/2004 | Wu et al. |
| 2004/0027701 | A1 | 2/2004 | Ishikawa |
| 2004/0043552 | A1 | 3/2004 | Strumpell et al. |
| 2004/0051929 | A1 | 3/2004 | Sampsell et al. |
| 2004/0058532 | A1 | 3/2004 | Miles et al. |
| 2004/0075967 | A1 | 4/2004 | Lynch et al. |
| 2004/0076802 | A1 | 4/2004 | Tompkin et al. |
| 2004/0080035 | A1 | 4/2004 | Delapierre |
| 2004/0100594 | A1 | 5/2004 | Huibers et al. |
| 2004/0100677 | A1 | 5/2004 | Huibers et al. |
| 2004/0125281 | A1 | 7/2004 | Lin et al. |
| 2004/0125282 | A1 | 7/2004 | Lin et al. |
| 2004/0145811 | A1 | 7/2004 | Lin et al. |
| 2004/0147198 | A1 | 7/2004 | Lin et al. |
| 2004/0175577 | A1 | 9/2004 | Lin et al. |
| 2004/0184134 | A1 | 9/2004 | Makigaki |
| 2004/0207897 | A1 | 10/2004 | Lin |
| 2004/0209195 | A1 | 10/2004 | Lin |
| 2004/0217919 | A1 | 11/2004 | Piehl et al. |
| 2004/0218251 | A1 | 11/2004 | Piehl et al. |
| 2004/0240032 | A1 | 12/2004 | Miles |
| 2005/0002082 | A1 | 1/2005 | Miles |
| 2005/0003667 | A1 | 1/2005 | Lin et al. |
| 2005/0024557 | A1 | 2/2005 | Lin |
| 2005/0035699 | A1 | 2/2005 | Tsai |
| 2005/0036095 | A1 | 2/2005 | Yeh et al. |
| 2005/0046919 | A1 | 3/2005 | Taguchi et al. |
| 2005/0046922 | A1 | 3/2005 | Lin et al. |
| 2005/0046948 | A1 | 3/2005 | Lin |
| 2005/0068627 | A1 | 3/2005 | Nakamura et al. |
| 2005/0078348 | A1 | 4/2005 | Lin |
| 2005/0168849 | A1 | 8/2005 | Lin |
| 2005/0179378 | A1 | 8/2005 | Oooka et al. |
| 2005/0195462 | A1 | 9/2005 | Lin |
| 2005/0249966 | A1 | 11/2005 | Tung et al. |

| | | |
|---|---|---|
| 2006/0007517 A1 | 1/2006 | Tsai |
| 2006/0017379 A1 | 1/2006 | Su et al. |
| 2006/0017689 A1 | 1/2006 | Faase et al. |
| 2006/0024880 A1 | 2/2006 | Chui et al. |
| 2006/0065940 A1 | 3/2006 | Kothari |
| 2006/0066599 A1 | 3/2006 | Chui |
| 2006/0066640 A1 | 3/2006 | Kothari et al. |
| 2006/0066641 A1 | 3/2006 | Gally et al. |
| 2006/0066935 A1 | 3/2006 | Cummings et al. |
| 2006/0066936 A1 | 3/2006 | Chui et al. |
| 2006/0067643 A1 | 3/2006 | Chui |
| 2006/0067649 A1 | 3/2006 | Tung et al. |
| 2006/0067651 A1 | 3/2006 | Chui |
| 2006/0077152 A1 | 4/2006 | Chui et al. |
| 2006/0077155 A1 | 4/2006 | Chui et al. |
| 2006/0077156 A1 | 4/2006 | Chui et al. |
| 2006/0077507 A1 | 4/2006 | Chui et al. |
| 2006/0077508 A1 | 4/2006 | Chui et al. |
| 2006/0077515 A1 | 4/2006 | Cummings |
| 2006/0077516 A1 | 4/2006 | Kothari |
| 2006/0079048 A1 | 4/2006 | Sampsell |
| 2006/0220160 A1 | 10/2006 | Miles |
| 2006/0262380 A1 | 11/2006 | Miles |
| 2006/0268388 A1 | 11/2006 | Miles |
| 2006/0274074 A1 | 12/2006 | Miles |
| 2006/0274398 A1 | 12/2006 | Chou |
| 2007/0020948 A1 | 1/2007 | Piehl et al. |
| 2007/0040777 A1 | 2/2007 | Cummings |
| 2007/0077525 A1 | 4/2007 | Davis et al. |
| 2007/0086078 A1 | 4/2007 | Hagood et al. |
| 2007/0121118 A1 | 5/2007 | Gally et al. |
| 2007/0138608 A1 | 6/2007 | Ikehashi |
| 2007/0177247 A1 | 8/2007 | Miles |
| 2007/0194630 A1 | 8/2007 | Mingard et al. |
| 2007/0216987 A1 | 9/2007 | Hagood et al. |
| 2007/0279729 A1 | 12/2007 | Kothari et al. |
| 2007/0285761 A1 | 12/2007 | Zhong et al. |
| 2008/0003710 A1 | 1/2008 | Kogut et al. |
| 2008/0013144 A1 | 1/2008 | Chui et al. |
| 2008/0013145 A1 | 1/2008 | Chui et al. |
| 2008/0013154 A1 | 1/2008 | Chui |
| 2008/0037093 A1 | 2/2008 | Miles |
| 2008/0055705 A1 | 3/2008 | Kothari |
| 2008/0055706 A1 | 3/2008 | Chui et al. |
| 2008/0055707 A1 | 3/2008 | Kogut et al. |
| 2008/0080043 A1 | 4/2008 | Chui et al. |
| 2008/0088904 A1 | 4/2008 | Miles |
| 2008/0088910 A1 | 4/2008 | Miles |
| 2008/0088911 A1 | 4/2008 | Miles |
| 2008/0088912 A1 | 4/2008 | Miles |
| 2008/0094690 A1 | 4/2008 | Luo et al. |
| 2008/0106782 A1 | 5/2008 | Miles |
| 2008/0110855 A1 | 5/2008 | Cummings |
| 2008/0112035 A1 | 5/2008 | Cummings |
| 2008/0112036 A1 | 5/2008 | Cummings |
| 2008/0186581 A1 | 8/2008 | Bita et al. |
| 2008/0239455 A1 | 10/2008 | Kogut et al. |
| 2008/0247028 A1 | 10/2008 | Chui et al. |
| 2008/0278787 A1 | 11/2008 | Sasagawa |
| 2008/0278788 A1 | 11/2008 | Sasagawa |
| 2008/0316566 A1 | 12/2008 | Lan |
| 2008/0316568 A1 | 12/2008 | Griffiths et al. |
| 2009/0009845 A1 | 1/2009 | Endisch et al. |
| 2009/0068781 A1 | 3/2009 | Tung et al. |
| 2009/0080060 A1 | 3/2009 | Sampsell et al. |
| 2009/0135465 A1 | 5/2009 | Chui |
| 2009/0201566 A1 | 8/2009 | Kothari |
| 2009/0213450 A1 | 8/2009 | Sampsell |
| 2009/0213451 A1 | 8/2009 | Tung et al. |
| 2009/0256218 A1 | 10/2009 | Mignard et al. |
| 2009/0273823 A1 | 11/2009 | Tung et al. |
| 2009/0273824 A1 | 11/2009 | Sasagawa |
| 2009/0279162 A1 | 11/2009 | Chui |

FOREIGN PATENT DOCUMENTS

| | | |
|---|---|---|
| EP | 0 668 490 | 8/1995 |
| EP | 1 122 577 | 8/2001 |
| EP | 1 227 346 | 7/2002 |
| EP | 1 275 997 | 1/2003 |
| EP | 1 473 581 | 11/2004 |
| JP | 5-49238 | 2/1993 |
| JP | 5-281479 | 10/1993 |
| JP | 11211999 | 8/1999 |
| JP | 2002-062490 | 2/2000 |
| JP | 2001-221913 | 8/2001 |
| JP | 2002-221678 | 8/2002 |
| JP | 2003-340795 | 2/2003 |
| JP | 2004-012642 | 1/2004 |
| JP | 2004-212638 | 7/2004 |
| JP | 2004-212680 | 7/2004 |
| JP | 2005 279831 | 10/2005 |
| WO | WO 98/14804 | 4/1998 |
| WO | WO 02/086582 | 10/2002 |
| WO | WO 2007/036422 | 4/2007 |
| WO | WO 2007/053438 | 5/2007 |
| WO | WO 2007/072998 | 6/2007 |

OTHER PUBLICATIONS

International Search Report and Written Opinion for International Application No. PCT/US2008/075733, dated Mar. 25, 2009.
ISR and WO dated Dec. 5, 2008 in PCT/US08/075733.
Longhurst, 1963, Chapter IX: Multiple Beam Interferometry, in Geometrical and Physical Optics, pp. 153-157.
Tolansky, 1948, Chapter II: Multiple-Beam Interference, in Multiple-bean Interferometry of Surfaces and Films, Oxford at the Clarendon Press, pp. 8-11.
Conner, "Hybrid Color Display Using Optical Interference Filter Array," SID Digest, pp. 577-580 (1993).
Jerman et al., "A Miniature Fabry-Perot Interferometer with a Corrugated Silicon Diaphragm Support", (1988).
Jerman et al., "Miniature Fabry-Perot Interferometers Micromachined in Silicon for Use in Optical Fiber WDM Systems," Transducers, San Francisco, Jun. 24-27, 1991, Proceedings on the Int'l. Conf. on Solid State Sensors and Actuators, vol. CONF. 6, Jun. 24, 1991, pp. 372-375.
Miles, Mark, W., "A New Reflective FPD Technology Using Interferometric Modulation", The Proceedings of the Society for Information Display (May 11-16, 1997).
Taii et al., "A transparent sheet display by plastic MEMS," Journal of the SID 14(8):735-741, 2006.
Pape et al., Characteristics of the deformable mirror device for optical information processing, Optical Engineering, 22(6):676-681, Nov.-Dec. 1983.
Kowarz et al., Conformal grating electromechanical system (GEMS) for high-speed digital light modulation, Proceedings of the IEEE 15th. Annual International Conference on Micro Electro Mechanical Systems, MEMS 2002, pp. 568-573.
Miles, Interferometric modulation: MOEMS as an enabling technology for high performance reflective displays, Proceedings of SPIE, vol. 4985, pp. 131-139, 2003.
Invitation to Pay Additional Fees dated Dec. 5, 2008 in PCT/US08/075733.
H.J. Lezec, "Submicrometer Dimple Array Based Interference Color Field Displays and Sensors" in Nano Lett. 7(2), 329-333, 2007.
IPRP dated Mar. 25, 2010 in PCT/US08/075733.

* cited by examiner

US 7,773,286 B2

PERIODIC DIMPLE ARRAY

RELATED APPLICATIONS

This application claims priority benefit to U.S. Provisional Application Ser. No. 60/972,715, filed Sep. 14, 2007, which is incorporated herein by reference in its entirety.

BACKGROUND

Microelectromechanical systems (MEMS) include micro mechanical elements, actuators, and electronics. Micromechanical elements may be created using deposition, etching, and/or other micromachining processes that etch away parts of substrates and/or deposited material layers or that add layers to form electrical and electromechanical devices. One type of MEMS device is called an interferometric modulator. As used herein, the term interferometric modulator or interferometric light modulator refers to a device that selectively absorbs and/or reflects light using the principles of optical interference. In certain embodiments, an interferometric modulator may comprise a pair of conductive plates, one or both of which may be transparent and/or reflective in whole or part and capable of relative motion upon application of an appropriate electrical signal. In a particular embodiment, one plate may comprise a stationary layer deposited on a substrate and the other plate may comprise a metallic membrane separated from the stationary layer by an air gap. As described herein in more detail, the position of one plate in relation to another can change the optical interference of light incident on the interferometric modulator. Such devices have a wide range of applications, and it would be beneficial in the art to utilize and/or modify the characteristics of these types of devices so that their features can be exploited in improving existing products and creating new products that have not yet been developed.

SUMMARY

In certain embodiments, a microelectromechanical (MEMS) device comprises a substrate, an actuation electrode over the substrate, a reflective layer over the actuation electrode, and a support layer between the actuation electrode and the reflective layer. The reflective layer includes at least one aperture through the reflective layer. The support layer includes a recess between the actuation electrode and the at least one aperture. Upon application of a control signal to the device, at least a first portion of the reflective layer is configured to move into the recess and at least a second portion of the reflective layer is configured to remain stationary. The reflectivity of the MEMS device is dominantly modulated by changing a phase difference between light reflected from the first portion and light reflected from the second portion.

In certain embodiments, a microelectromechanical (MEMS) device comprises means for applying a control signal, means for supporting the control signal applying means, means for modulating light, and means for supporting the light modulating means. The control signal applying means is over the means for supporting the control signal applying means. The light modulating means is over the means for supporting the control signal applying means. The means for supporting the light modulating means is between the control signal applying means and the light modulating means. The light modulating means includes means for conducting a fluid through the light modulating means. The means for supporting the light modulating means includes a recess between the control signal applying means and the fluid conducting means. Upon application of a control signal to the device, at least a first portion of the light modulating means is configured to move into the recess and at least a second portion of the light modulating means is configured to remain stationary. The reflectivity of the MEMS device is dominantly modulated by changing a phase difference between light reflected from the first portion and light reflected from the second portion.

In certain embodiments, a method of manufacturing a microelectromechanical (MEMS) device comprises forming an actuation electrode over a substrate, forming a support layer over the actuation electrode, forming a reflective layer over the support layer, forming at least one aperture through the reflective layer, and removing a first portion of the support layer between the actuation electrode and the at least one aperture while a second portion of the support layer remains. The second portion supports the reflective layer. A width of the first portion is larger than a width of the at least one aperture. After removal, the reflectivity of the MEMS device is dominantly modulated by changing a phase difference between light reflected from the first portion and light reflected from the second portion.

In certain embodiments, a display device for presenting an image to a viewer comprises a base layer comprising a first region comprising a plurality of recesses in a surface of the base layer and a reflective layer over the base layer. Each of the recesses has a width of less than about 1 µm. Adjacent recesses are in a pattern that is periodic in two dimensions and have a center-to-center distance less than about 2 µm. The recesses have a depth into the surface of the base layer. The reflective layer comprises a first portion and a second portion. The first portion is over the first region and within the recesses. The second portion is over the first region, between the recesses, and not within the recesses. A ratio of an area of the first portion to an area of the second portion is less than about 1:1.

In certain embodiments, a display device for presenting an image to a viewer comprises means for modulating light and means for supporting the light modulating means. The supporting means comprises a first region comprising a plurality of recesses in a surface of the supporting means. The light modulating means is over the means for supporting the light modulating means. Each of the recesses has a width of less than about 1 µm. Adjacent recesses are in a pattern that is periodic in two dimensions and have a center-to-center distance less than about 2 µm. The recesses have a depth into the surface of the supporting means. The light modulating means comprises a first portion and a second portion. The first portion is over the first region and within the recesses. The second portion is over the first region, between the recesses, and not within the recesses. A ratio of an area of the first portion to an area of the second portion is less than about 1:1.

In certain embodiments, a method of forming a reflective surface comprises providing a base layer, forming a first region comprising forming a plurality of recesses in a surface of the base layer, and depositing a layer of reflective material over the base layer. Each of the recesses has a width of less than about 1 µm. Adjacent recesses are in a pattern that is periodic in two dimensions along the base layer and have a center-to-center distance less than about 2 µm. The recesses have a depth into the surface of the base layer.

DETAILED DESCRIPTION OF THE PREFERRED EMBODIMENTS

The following detailed description is directed to certain specific embodiments of the invention. However, the invention can be embodied in a multitude of different ways. In this description, reference is made to the drawings wherein like parts are designated with like numerals throughout. As will be apparent from the following description, the embodiments may be implemented in any device that is configured to display an image, whether in motion (e.g., video) or stationary (e.g., still image), and whether textual or pictorial. More particularly, it is contemplated that the embodiments may be implemented in or associated with a variety of electronic devices such as, but not limited to, mobile telephones, wireless devices, personal data assistants (PDAs), hand-held or portable computers, GPS receivers/navigators, cameras, MP3 players, camcorders, game consoles, wrist watches, clocks, calculators, television monitors, flat panel displays, computer monitors, auto displays (e.g., odometer display, etc.), cockpit controls and/or displays, display of camera views (e.g., display of a rear view camera in a vehicle), electronic photographs, electronic billboards or signs, projectors, architectural structures, packaging, and aesthetic structures (e.g., display of images on a piece of jewelry). MEMS devices of similar structure to those described herein can also be used in non-display applications such as in electronic switching devices.

Display devices are provided that can modulate reflected light by modulating a phase difference between light reflected from a portion of a reflective layer that is in one or more recesses in a support structure and light reflected from a portion of the reflective layer outside the recesses. The lateral length of the recess is approximately the same as the spacing between adjacent recesses (e.g., a ratio of the recess to the spacing between the recesses is about 1:1). The color perceived by a viewer is influenced by the depth of the recesses, which are on the order of a wavelength of light. Recesses having a flat bottom reflect light more uniformly than recesses having a rounded bottom. The reflective layer may be movable in and out of the recesses by application of a control signal in a MEMS device or may remain in the recess in a static structure. In MEMS devices, the reflective layer may move in and out of the recess in stages to provide different levels of modulation. A support structure and a reflective layer supported thereby may move together to provide different levels of modulation in a static structure or MEMS device. Generally parallel portions of reflective layers supported by support structures having varying thicknesses may be laterally and/or vertically spaced.

Figure 1:
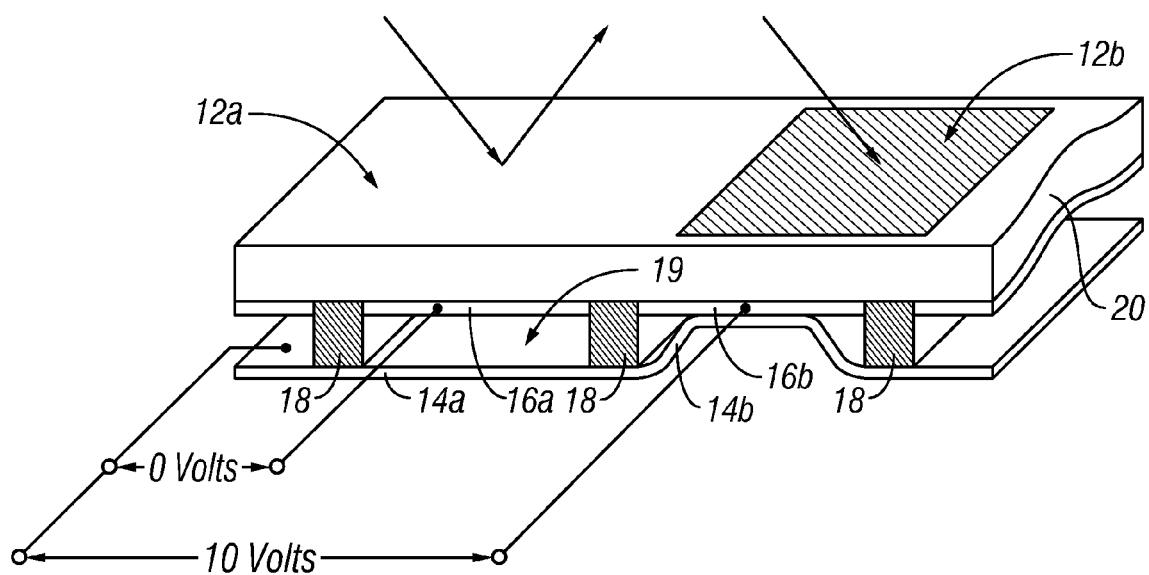
FIG. 1 is an isometric view depicting a portion of one embodiment of an interferometric modulator display in which a movable reflective layer of a first interferometric modulator is in a relaxed position and a movable reflective layer of a second interferometric modulator is in an actuated position.

One interferometric modulator display embodiment comprising an interferometric MEMS display element is illustrated in FIG. 1. In these devices, the pixels are in either a bright or dark state. In the bright ("on" or "open") state, the display element reflects a large portion of incident visible light to a user. When in the dark ("off" or "closed") state, the display element reflects little incident visible light to the user. Depending on the embodiment, the light reflectance properties of the "on" and "off" states may be reversed. MEMS pixels can be configured to reflect predominantly at selected colors, allowing for a color display in addition to black and white.

FIG. 1 is an isometric view depicting two adjacent pixels in a series of pixels of a visual display, wherein each pixel comprises a MEMS interferometric modulator. In some embodiments, an interferometric modulator display comprises a row/column array of these interferometric modulators. Each interferometric modulator includes a pair of reflective layers positioned at a variable and controllable distance from each other to form a resonant optical gap with at least one variable dimension. In one embodiment, one of the reflective layers may be moved between two positions. In the first position, referred to herein as the relaxed position, the movable reflective layer is positioned at a relatively large distance from a fixed partially reflective layer. In the second position, referred to herein as the actuated position, the movable reflective layer is positioned more closely adjacent to the partially reflective layer. Incident light that reflects from the two layers interferes constructively or destructively depending on the position of the movable reflective layer, producing either an overall reflective or non-reflective state for each pixel.

The depicted portion of the pixel array in FIG. 1 includes two adjacent interferometric modulators 12a and 12b. In the interferometric modulator 12a on the left, a movable reflective layer 14a is illustrated in a relaxed position at a predetermined distance from an optical stack 16a, which includes a partially reflective layer. In the interferometric modulator 12b on the right, the movable reflective layer 14b is illustrated in an actuated position adjacent to the optical stack 16b.

The optical stacks 16a and 16b (collectively referred to as optical stack 16), as referenced herein, typically comprise several fused layers, which can include an electrode layer, such as indium tin oxide (ITO), a partially reflective layer, such as chromium, and a transparent dielectric. The optical stack 16 is thus electrically conductive, partially transparent, and partially reflective, and may be fabricated, for example, by depositing one or more of the above layers onto a transparent substrate 20. The partially reflective layer can be formed from a variety of materials that are partially reflective such as various metals, semiconductors, and dielectrics. The partially reflective layer can be formed of one or more layers of materials, and each of the layers can be formed of a single material or a combination of materials.

In some embodiments, the layers of the optical stack 16 are patterned into parallel strips, and may form row electrodes in a display device as described further below. The movable reflective layers 14a, 14b may be formed as a series of parallel strips of a deposited metal layer or layers (orthogonal to the row electrodes of 16a, 16b) deposited on top of posts 18 and an intervening sacrificial material deposited between the posts 18. When the sacrificial material is etched away, the movable reflective layers 14a, 14b are separated from the optical stacks 16a, 16b by a defined gap 19. A highly conductive and reflective material such as aluminum may be used for the reflective layers 14, and these strips may form column electrodes in a display device.

With no applied voltage, the gap 19 remains between the movable reflective layer 14a and optical stack 16a, with the movable reflective layer 14a in a mechanically relaxed state, as illustrated by the pixel 12a in FIG. 1. However, when a potential difference is applied to a selected row and column, the capacitor formed at the intersection of the row and column electrodes at the corresponding pixel becomes charged, and electrostatic forces pull the electrodes together. If the voltage is high enough, the movable reflective layer 14 is deformed and is forced against the optical stack 16. A dielectric layer (not illustrated in this Figure) within the optical stack 16 may prevent shorting and control the separation distance between layers 14 and 16, as illustrated by pixel 12b on the right in FIG. 1. The behavior is the same regardless of the polarity of the applied potential difference. In this way, row/column actuation that can control the reflective vs. non-reflective pixel states is analogous in many ways to that used in conventional LCD and other display technologies.

FIGS. 2 through 5B illustrate one exemplary process and system for using an array of interferometric modulators in a display application.

Figure 2:
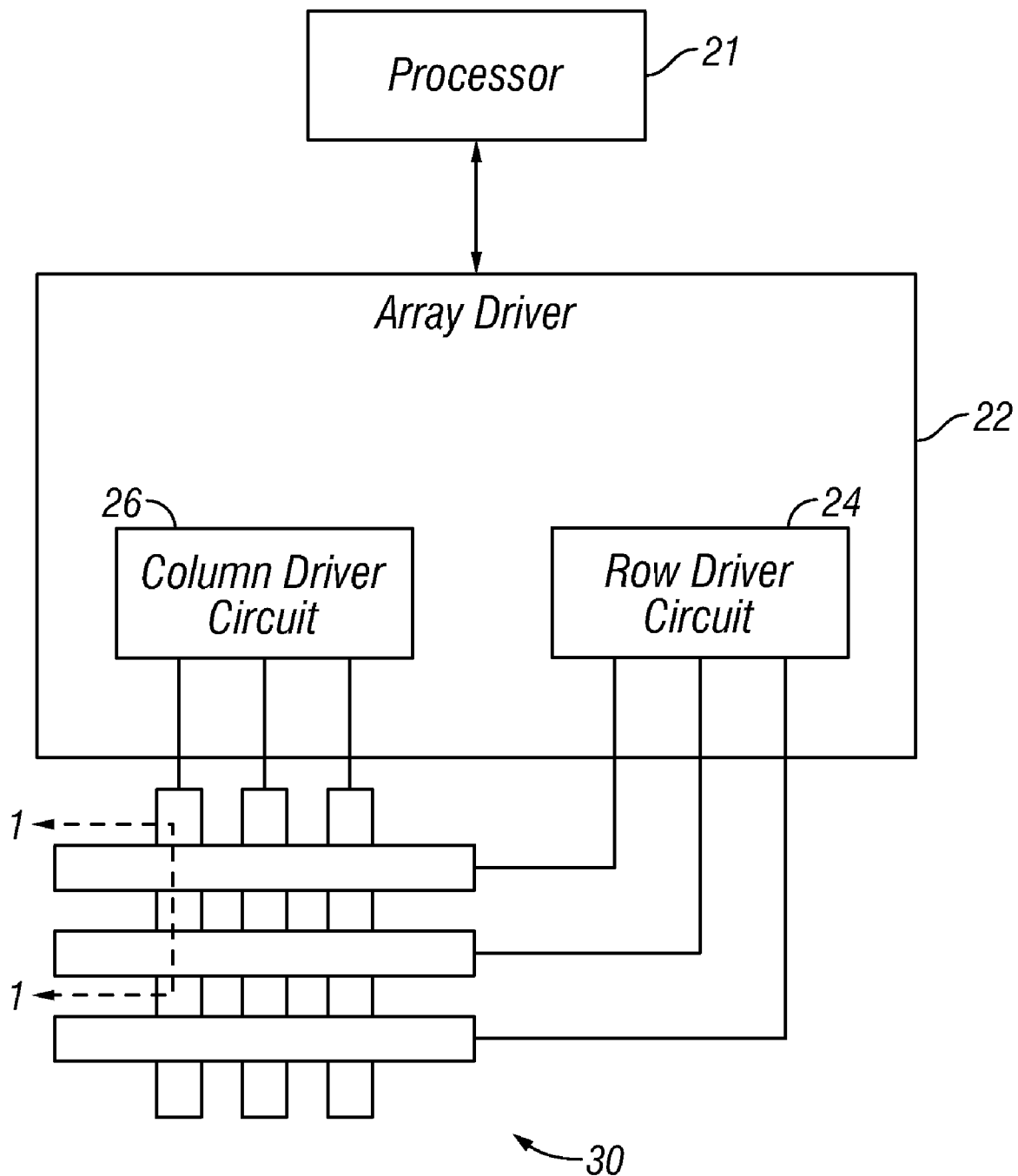
FIG. 2 is a system block diagram illustrating one embodiment of an electronic device incorporating a 3×3 interferometric modulator display.

FIG. 2 is a system block diagram illustrating one embodiment of an electronic device that may incorporate aspects of the invention. In the exemplary embodiment, the electronic device includes a processor 21 which may be any general purpose single- or multi-chip microprocessor such as an ARM, Pentium®, Pentium II®, Pentium III®, Pentium IV®, Pentium® Pro, an 8051, a MIPS®, a Power PC®, an ALPHA®, or any special purpose microprocessor such as a digital signal processor, microcontroller, or a programmable gate array. As is conventional in the art, the processor 21 may be configured to execute one or more software modules. In addition to executing an operating system, the processor may be configured to execute one or more software applications, including a web browser, a telephone application, an email program, or any other software application.

In one embodiment, the processor 21 is also configured to communicate with an array driver 22. In one embodiment, the array driver 22 includes a row driver circuit 24 and a column driver circuit 26 that provide signals to a display array or panel 30. The cross section of the array illustrated in FIG. 1 is shown by the lines 1-1 in FIG. 2. For MEMS interferometric modulators, the row/column actuation protocol may take advantage of a hysteresis property of these devices illustrated in FIG. 3. It may require, for example, a 10 volt potential difference to cause a movable layer to deform from the relaxed state to the actuated state. However, when the voltage is reduced from that value, the movable layer maintains its state as the voltage drops back below 10 volts. In the exemplary embodiment of FIG. 3, the movable layer does not relax completely until the voltage drops below 2 volts. Thus, there exists a window of applied voltage, about 3 to 7 V in the example illustrated in FIG. 3, within which the device is stable in either the relaxed or actuated state. This is referred to herein as the "hysteresis window" or "stability window." For a display array having the hysteresis characteristics of FIG. 3, the row/column actuation protocol can be designed such that during row strobing, pixels in the strobed row that are to be actuated are exposed to a voltage difference of about 10 volts, and pixels that are to be relaxed are exposed to a voltage difference of close to zero volts. After the strobe, the pixels are exposed to a steady state voltage difference of about 5 volts such that they remain in whatever state the row strobe put them in. After being written, each pixel sees a potential difference within the "stability window" of 3-7 volts in this example. This feature makes the pixel design illustrated in FIG. 1 stable under the same applied voltage conditions in either an actuated or relaxed pre-existing state. Since each pixel of the interferometric modulator, whether in the actuated or relaxed state, is essentially a capacitor formed by the fixed and moving reflective layers, this stable state can be held at a voltage within the hysteresis window with almost no power dissipation. Essentially no current flows into the pixel if the applied potential is fixed.

In typical applications, a display frame may be created by asserting the set of column electrodes in accordance with the desired set of actuated pixels in the first row. A row pulse is then applied to the row 1 electrode, actuating the pixels corresponding to the asserted column lines. The asserted set of column electrodes is then changed to correspond to the desired set of actuated pixels in the second row. A pulse is then applied to the row 2 electrode, actuating the appropriate pixels in row 2 in accordance with the asserted column electrodes. The row 1 pixels are unaffected by the row 2 pulse, and remain in the state they were set to during the row 1 pulse. This may be repeated for the entire series of rows in a sequential fashion to produce the frame. Generally, the frames are refreshed and/or updated with new display data by continually repeating this process at some desired number of frames per second. A wide variety of protocols for driving row and column electrodes of pixel arrays to produce display frames are also well known and may be used in conjunction with the present invention.

Figures 3, 4:
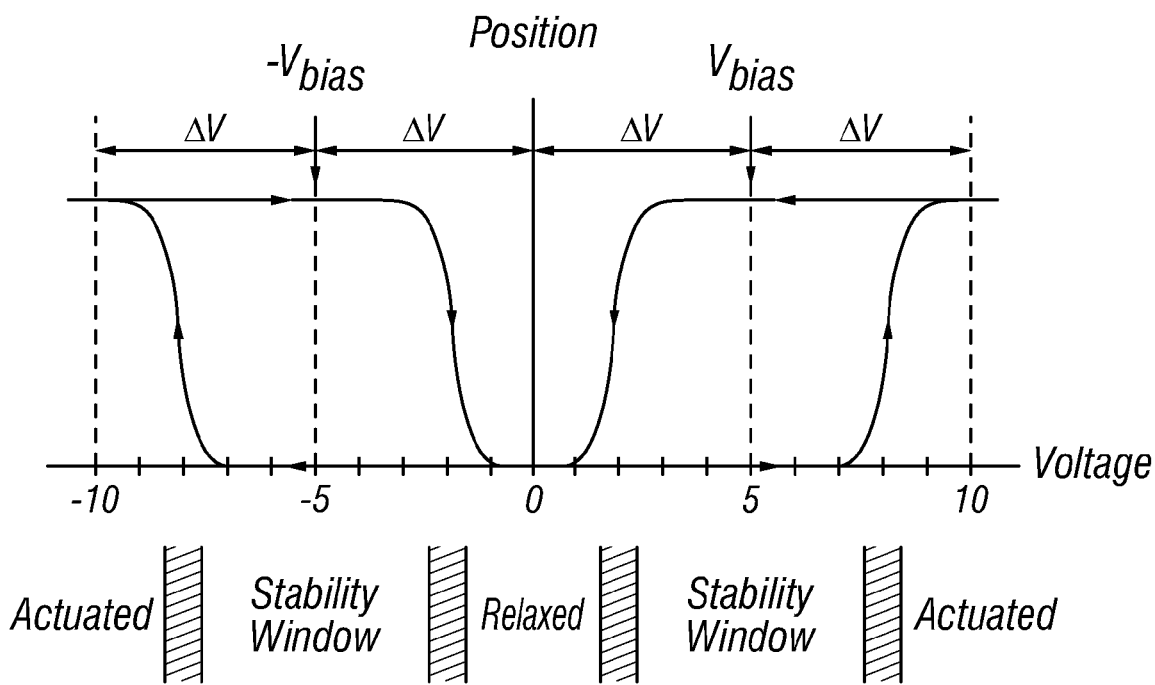
FIG. 3 is a diagram of movable mirror position versus applied voltage for one exemplary embodiment of an interferometric modulator of FIG. 1.
FIG. 4 is an illustration of a set of row and column voltages that may be used to drive an interferometric modulator display.
Figure 5A:
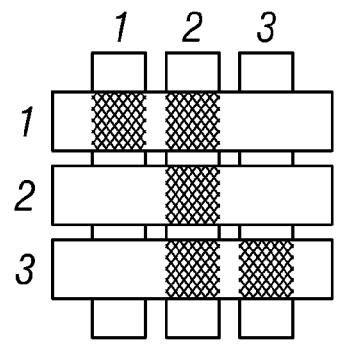
FIG. 5A illustrates one exemplary frame of display data in the 3×3 interferometric modulator display of FIG. 2.
Figure 5B:
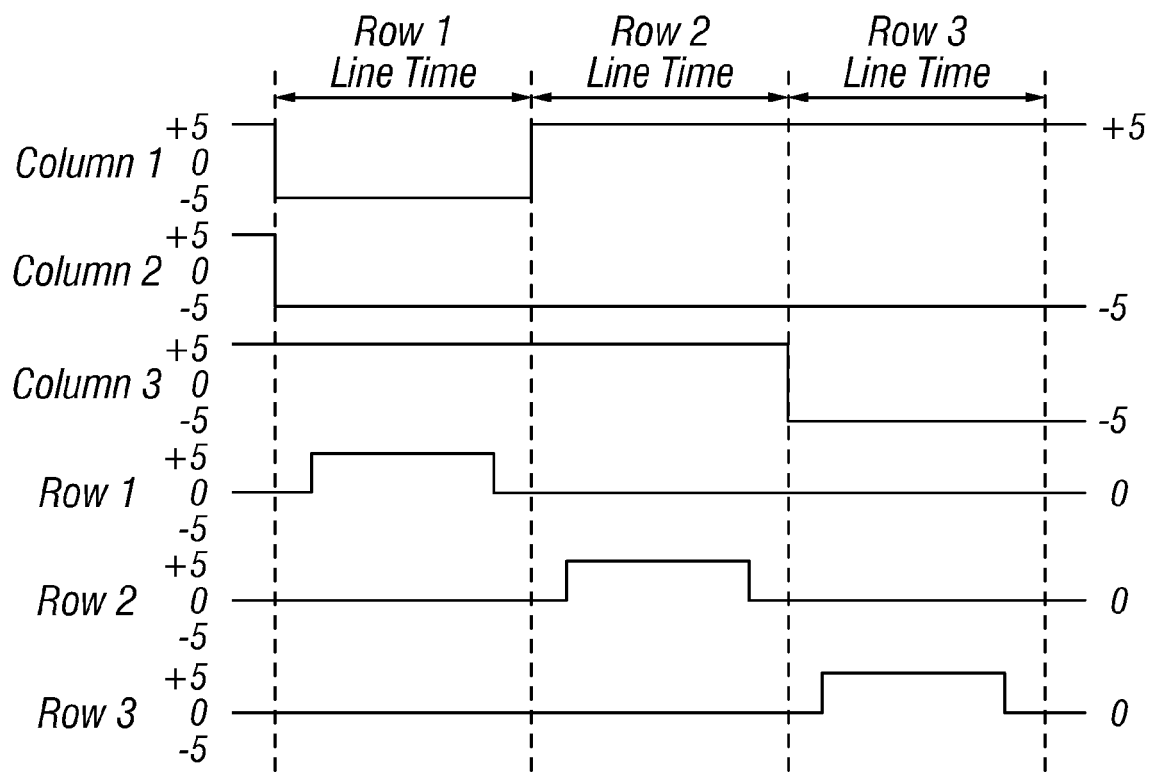
FIG. 5B illustrates one exemplary timing diagram for row and column signals that may be used to write the frame of FIG. 5A.

FIGS. 4, 5A, and 5B illustrate one possible actuation protocol for creating a display frame on the 3×3 array of FIG. 2. FIG. 4 illustrates a possible set of column and row voltage levels that may be used for pixels exhibiting the hysteresis curves of FIG. 3. In the FIG. 4 embodiment, actuating a pixel involves setting the appropriate column to $-V_{bias}$, and the appropriate row to $+\Delta V$, which may correspond to −5 volts and +5 volts, respectively. Relaxing the pixel is accomplished by setting the appropriate column to $+V_{bias}$, and the appropriate row to the same $+\Delta V$, producing a zero volt potential difference across the pixel. In those rows where the row voltage is held at zero volts, the pixels are stable in whatever state they were originally in, regardless of whether the column is at $+V_{bias}$, or $-V_{bias}$. As is also illustrated in FIG. 4, it will be appreciated that voltages of opposite polarity than those described above can be used, e.g., actuating a pixel can involve setting the appropriate column to $+V_{bias}$, and the appropriate row to $-\Delta V$. In this embodiment, releasing the pixel is accomplished by setting the appropriate column to $-V_{bias}$, and the appropriate row to the same $-\Delta V$, producing a zero volt potential difference across the pixel.

FIG. 5B is a timing diagram showing a series of row and column signals applied to the 3×3 array of FIG. 2 which will result in the display arrangement illustrated in FIG. 5A, where actuated pixels are non-reflective. Prior to writing the frame illustrated in FIG. 5A, the pixels can be in any state, and in this example, all the rows are at 0 volts, and all the columns are at +5 volts. With these applied voltages, all pixels are stable in their existing actuated or relaxed states.

In the FIG. 5A frame, pixels (1,1), (1,2), (2,2), (3,2) and (3,3) are actuated. To accomplish this, during a "line time" for row 1, columns 1 and 2 are set to −5 volts, and column 3 is set to +5 volts. This does not change the state of any pixels, because all the pixels remain in the 3-7 volt stability window. Row 1 is then strobed with a pulse that goes from 0, up to 5 volts, and back to zero. This actuates the (1,1) and (1,2) pixels and relaxes the (1,3) pixel. No other pixels in the array are affected. To set row 2 as desired, column 2 is set to −5 volts, and columns 1 and 3 are set to +5 volts. The same strobe applied to row 2 will then actuate pixel (2,2) and relax pixels (2,1) and (2,3). Again, no other pixels of the array are affected. Row 3 is similarly set by setting columns 2 and 3 to −5 volts, and column 1 to +5 volts. The row 3 strobe sets the row 3 pixels as shown in FIG. 5A. After writing the frame, the row potentials are zero, and the column potentials can remain at either +5 or −5 volts, and the display is then stable in the arrangement of FIG. 5A. It will be appreciated that the same procedure can be employed for arrays of dozens or hundreds of rows and columns. It will also be appreciated that the timing, sequence, and levels of voltages used to perform row and column actuation can be varied widely within the general principles outlined above, and the above example is exemplary only, and any actuation voltage method can be used with the systems and methods described herein.

Figure 6A:
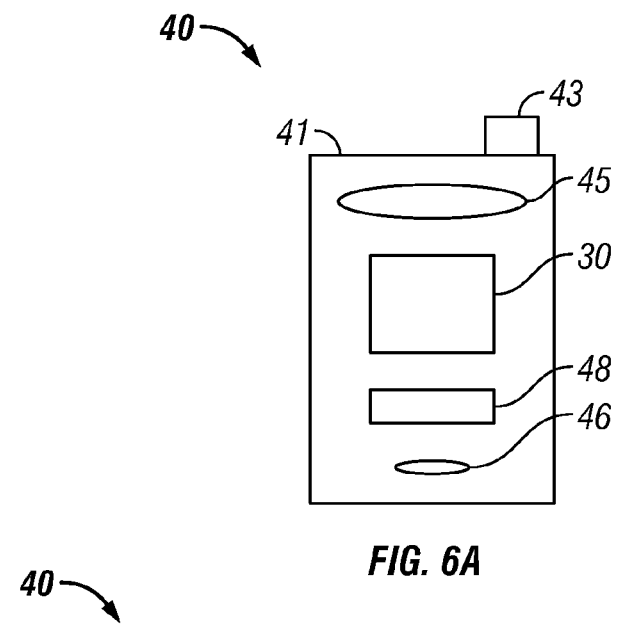
FIGS. 6A and 6B are system block diagrams illustrating an embodiment of a visual display device comprising a plurality of interferometric modulators.
Figure 6B:
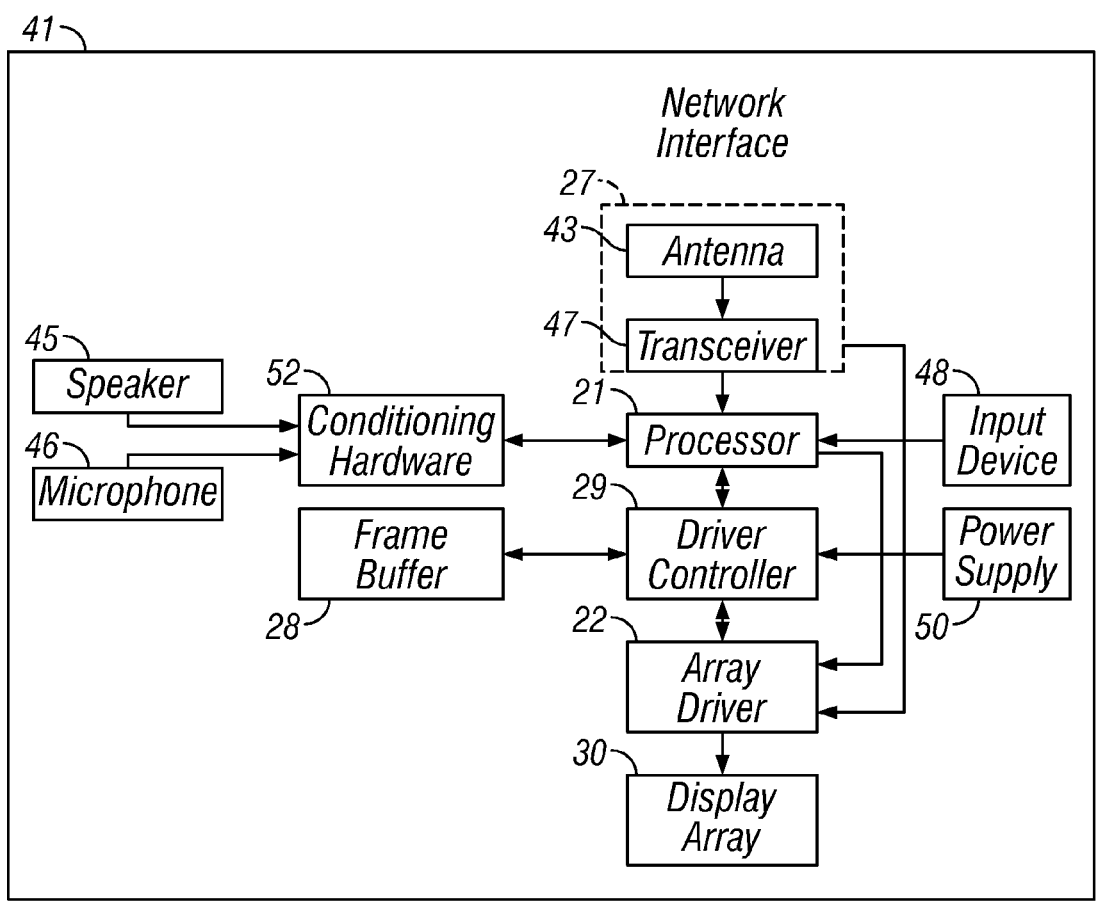

FIGS. 6A and 6B are system block diagrams illustrating an embodiment of a display device 40. The display device 40 can be, for example, a cellular or mobile telephone. However, the same components of display device 40 or slight variations thereof are also illustrative of various types of display devices such as televisions and portable media players.

The display device 40 includes a housing 41, a display 30, an antenna 43, a speaker 45, an input device 48, and a microphone 46. The housing 41 is generally formed from any of a variety of manufacturing processes as are well known to those of skill in the art, including injection molding and vacuum forming. In addition, the housing 41 may be made from any of a variety of materials, including, but not limited to, plastic, metal, glass, rubber, and ceramic, or a combination thereof. In one embodiment, the housing 41 includes removable portions (not shown) that may be interchanged with other removable portions of different color, or containing different logos, pictures, or symbols.

The display 30 of exemplary display device 40 may be any of a variety of displays, including a bi-stable display, as described herein. In other embodiments, the display 30 includes a flat-panel display, such as plasma, EL, OLED, STN LCD, or TFT LCD as described above, or a non-flat-panel display, such as a CRT or other tube device, as is well known to those of skill in the art. However, for purposes of describing the present embodiment, the display 30 includes an interferometric modulator display, as described herein.

The components of one embodiment of exemplary display device 40 are schematically illustrated in FIG. 6B. The illustrated exemplary display device 40 includes a housing 41 and can include additional components at least partially enclosed therein. For example, in one embodiment, the exemplary display device 40 includes a network interface 27 that includes an antenna 43, which is coupled to a transceiver 47. The transceiver 47 is connected to a processor 21, which is connected to conditioning hardware 52. The conditioning hardware 52 may be configured to condition a signal (e.g., filter a signal). The conditioning hardware 52 is connected to a speaker 45 and a microphone 46. The processor 21 is also connected to an input device 48 and a driver controller 29. The driver controller 29 is coupled to a frame buffer 28 and to an array driver 22, which in turn is coupled to a display array 30. A power supply 50 provides power to all components as required by the particular exemplary display device 40 design.

The network interface 27 includes the antenna 43 and the transceiver 47 so that the exemplary display device 40 can communicate with one or more devices over a network. In one embodiment, the network interface 27 may also have some processing capabilities to relieve requirements of the processor 21. The antenna 43 is any antenna known to those of skill in the art for transmitting and receiving signals. In one embodiment, the antenna transmits and receives RF signals according to the IEEE 802.11 standard, including IEEE 802.11(a), (b), or (g). In another embodiment, the antenna transmits and receives RF signals according to the BLUETOOTH standard. In the case of a cellular telephone, the antenna is designed to receive CDMA, GSM, AMPS, or other known signals that are used to communicate within a wireless cell phone network. The transceiver 47 pre-processes the signals received from the antenna 43 so that they may be received by and further manipulated by the processor 21. The transceiver 47 also processes signals received from the processor 21 so that they may be transmitted from the exemplary display device 40 via the antenna 43.

In an alternative embodiment, the transceiver 47 can be replaced by a receiver. In yet another alternative embodiment, network interface 27 can be replaced by an image source, which can store or generate image data to be sent to the processor 21. For example, the image source can be a digital video disc (DVD) or a hard-disc drive that contains image data, or a software module that generates image data.

Processor 21 generally controls the overall operation of the exemplary display device 40. The processor 21 receives data, such as compressed image data from the network interface 27 or an image source, and processes the data into raw image data or into a format that is readily processed into raw image data. The processor 21 then sends the processed data to the driver controller 29 or to frame buffer 28 for storage. Raw data typically refers to the information that identifies the image characteristics at each location within an image. For example, such image characteristics can include color, saturation, and gray-scale level.

In one embodiment, the processor 21 includes a microcontroller, CPU, or logic unit to control operation of the exemplary display device 40. Conditioning hardware 52 generally includes amplifiers and filters for transmitting signals to the speaker 45, and for receiving signals from the microphone 46. Conditioning hardware 52 may be discrete components within the exemplary display device 40, or may be incorporated within the processor 21 or other components.

The driver controller 29 takes the raw image data generated by the processor 21 either directly from the processor 21 or from the frame buffer 28 and reformats the raw image data appropriately for high speed transmission to the array driver 22. Specifically, the driver controller 29 reformats the raw image data into a data flow having a raster-like format, such that it has a time order suitable for scanning across the display array 30. Then the driver controller 29 sends the formatted information to the array driver 22. Although a driver controller 29, such as a LCD controller, is often associated with the system processor 21 as a stand-alone Integrated Circuit (IC), such controllers may be implemented in many ways. They may be embedded in the processor 21 as hardware, embedded in the processor 21 as software, or fully integrated in hardware with the array driver 22.

Typically, the array driver 22 receives the formatted information from the driver controller 29 and reformats the video data into a parallel set of waveforms that are applied many times per second to the hundreds and sometimes thousands of leads coming from the display's x-y matrix of pixels.

In one embodiment, the driver controller 29, array driver 22, and display array 30 are appropriate for any of the types of displays described herein. For example, in one embodiment, driver controller 29 is a conventional display controller or a bi-stable display controller (e.g., an interferometric modulator controller). In another embodiment, array driver 22 is a conventional driver or a bi-stable display driver (e.g., an interferometric modulator display). In one embodiment, a driver controller 29 is integrated with the array driver 22. Such an embodiment is common in highly integrated systems such as cellular phones, watches, and other small area displays. In yet another embodiment, display array 30 is a typical display array or a bi-stable display array (e.g., a display including an array of interferometric modulators).

The input device 48 allows a user to control the operation of the exemplary display device 40. In one embodiment, input device 48 includes a keypad, such as a QWERTY keyboard or a telephone keypad, a button, a switch, a touch-sensitive screen, or a pressure- or heat-sensitive membrane. In one embodiment, the microphone 46 is an input device for the exemplary display device 40. When the microphone 46 is used to input data to the device, voice commands may be provided by a user for controlling operations of the exemplary display device 40.

Power supply 50 can include a variety of energy storage devices as are well known in the art. For example, in one embodiment, power supply 50 is a rechargeable battery, such as a nickel-cadmium battery or a lithium ion battery. In another embodiment, power supply 50 is a renewable energy source, a capacitor, or a solar cell including a plastic solar cell, and solar-cell paint. In another embodiment, power supply 50 is configured to receive power from a wall outlet.

In some embodiments, control programmability resides, as described above, in a driver controller which can be located in several places in the electronic display system. In some embodiments, control programmability resides in the array driver 22. Those of skill in the art will recognize that the above-described optimizations may be implemented in any number of hardware and/or software components and in various configurations.

Figure 7A:
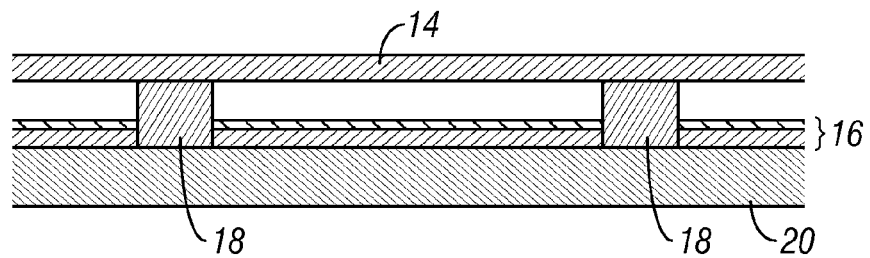
FIG. 7A is a cross section of the device of FIG. 1.
Figure 7B:
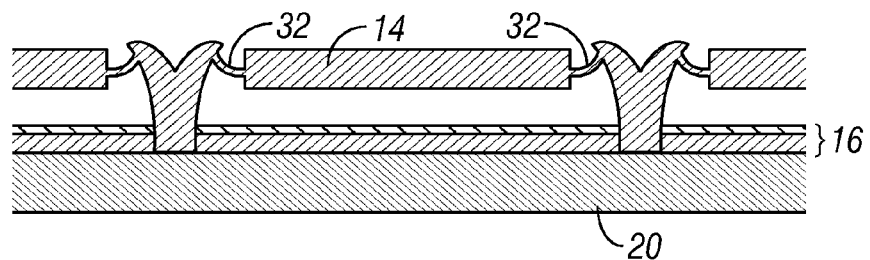
FIG. 7B is a cross section of an alternative embodiment of an interferometric modulator.
Figure 7C:
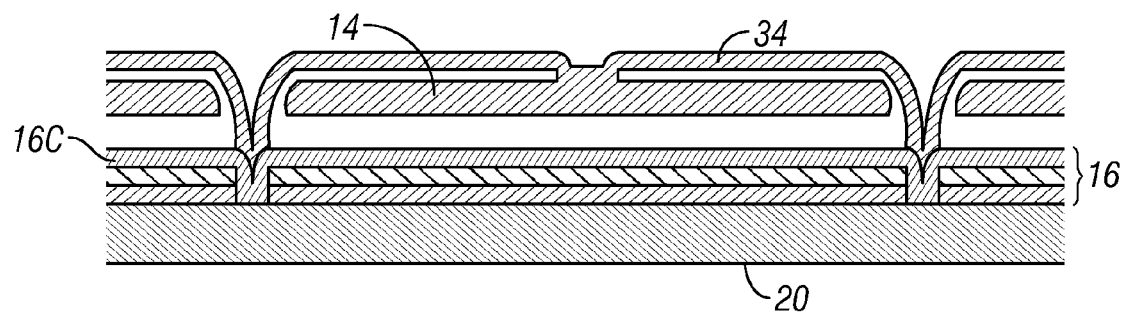
FIG. 7C is a cross section of another alternative embodiment of an interferometric modulator.
Figure 7D:
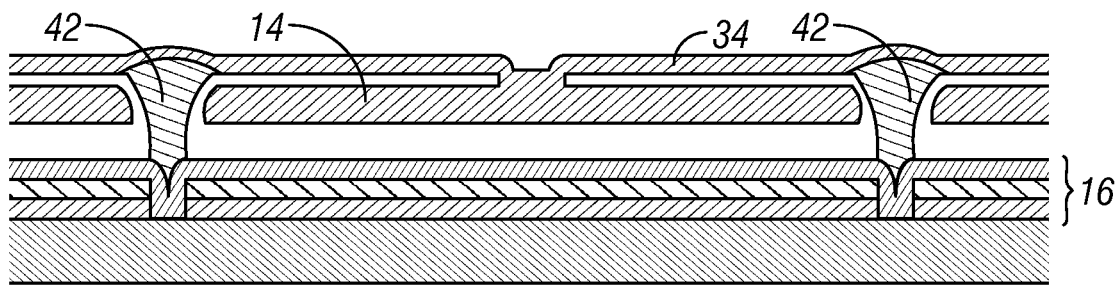
FIG. 7D is a cross section of yet another alternative embodiment of an interferometric modulator.
Figure 7E:
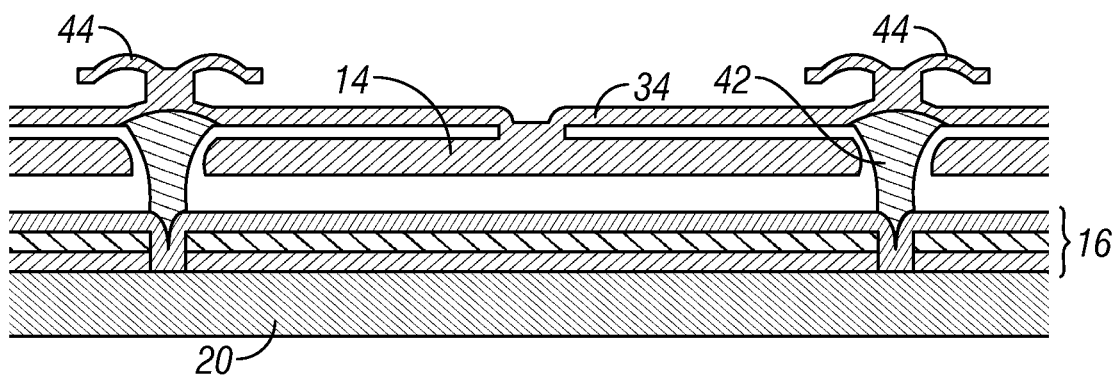
FIG. 7E is a cross section of an additional alternative embodiment of an interferometric modulator.

The details of the structure of interferometric modulators that operate in accordance with the principles set forth above may vary widely. For example, FIGS. 7A-7E illustrate five different embodiments of the movable reflective layer 14 and its supporting structures. FIG. 7A is a cross section of the embodiment of FIG. 1, where a strip of metal material 14 is deposited on orthogonally extending supports 18. In FIG. 7B, the movable reflective layer 14 is attached to supports at the corners only, on tethers 32. In FIG. 7C, the movable reflective layer 14 is suspended from a deformable layer 34, which may comprise a flexible metal. The deformable layer 34 connects, directly or indirectly, to the substrate 20 around the perimeter of the deformable layer 34. These connections are herein referred to as support posts. The embodiment illustrated in FIG. 7D has support post plugs 42 upon which the deformable layer 34 rests. The movable reflective layer 14 remains suspended over the gap, as in FIGS. 7A-7C, but the deformable layer 34 does not form the support posts by filling holes between the deformable layer 34 and the optical stack 16. Rather, the support posts are formed of a planarization material, which is used to form support post plugs 42. The embodiment illustrated in FIG. 7E is based on the embodiment shown in FIG. 7D, but may also be adapted to work with any of the embodiments illustrated in FIGS. 7A-7C, as well as additional embodiments not shown. In the embodiment shown in FIG. 7E, an extra layer of metal or other conductive material has been used to form a bus structure 44. This allows signal routing along the back of the interferometric modulators, eliminating a number of electrodes that may otherwise have had to be formed on the substrate 20.

In embodiments such as those shown in FIG. 7, the interferometric modulators function as direct-view devices, in which images are viewed from the front side of the transparent substrate 20, the side opposite to that upon which the modulator is arranged. In these embodiments, the reflective layer 14 optically shields the portions of the interferometric modulator on the side of the reflective layer opposite the substrate 20, including the deformable layer 34. This allows the shielded areas to be configured and operated upon without negatively affecting the image quality. Such shielding allows the bus structure 44 in FIG. 7E, which provides the ability to separate the optical properties of the modulator from the electromechanical properties of the modulator, such as addressing and the movements that result from that addressing. This separable modulator architecture allows the structural design and materials used for the electromechanical aspects and the optical aspects of the modulator to be selected and to function independently of each other. Moreover, the embodiments shown in FIGS. 7C-7E have additional benefits deriving from the decoupling of the optical properties of the reflective layer 14 from its mechanical properties, which are carried out by the deformable layer 34. This allows the structural design and materials used for the reflective layer 14 to be optimized with respect to the optical properties, and the structural design and materials used for the deformable layer 34 to be optimized with respect to desired mechanical properties.

As discussed above, the interferometric characteristics (e.g., apparent color, reflectivity, etc.) of certain embodiments of MEMS devices can be modulated by modifying the distance between a partially reflective layer and a fully reflective layer. In certain devices including a partially reflective layer and a fully reflective layer (e.g., the MEMS devices 12a, 12b illustrated in FIG. 1), the reflective layer 14 may be on the order of about 100 microns (μm)×100 μm, a spacing between adjacent reflective layers 14 may be on the order of about 1 to 5 μm, and a cavity 19 between the optical stack 16 comprising a partially reflective layer, and the fully reflective layer 14 may have an area on the order of about 1,000 angstroms (Å). When the MEMS device 12 is in an actuated state (e.g., as illustrated by the MEMS device 12b on the right side of FIG. 1), the interferometric modulation is dominantly caused by the portion of the reflective layer 14 in "optical contact" with the optical stack 16 (e.g., when the cavity 19 is zero or nearly zero). As used herein, the term "dominantly" is to be given its broadest ordinary meaning including, but not limited to, exercising the most influence. However, since the periphery of the reflective layer 14 is spaced from the optical stack 16 by the post or rail 18, the region near the post or rail 18 does not have the same level of optical contact as the central part of the MEMS device 12. Thus, a different interferometric characteristic can occur in the region near the posts 18 (e.g., the edges of the MEMS device 12 may reflect a different color than in the region in optical contact), which can degrade the quality (contrast ratio, color saturation, gamut, etc.) of an image generated by an array of such MEMS devices 12. Various techniques can be used to mitigate these edge effects, for example separating the deformable layer 34 and the reflective layer 14 (e.g., as illustrated in FIGS. 7C-7E) and utilizing structures such as black masks to mask the effect. However, such techniques can cause other problems. For example, the separated deformable layer 34 can significant increase manufacturing complexity or costs and the reflective layer 14 may tilt or curl. Furthermore, a black mask can increase manufacturing complexity or costs and can reduce the aperture ratio.

In contrast to the interferometric modulators of FIG. 1 or FIG. 7A-C in which the movable reflective layer 14 is significantly larger than the spacing between adjacent reflective layers 14, (e.g., where the reflective layer 14 is between about 100 μm×100 μm and the spacing between adjacent reflective layers 14 is between about 1 and 5 μm, such that the length of one side of the reflective layer 14 is between about 20× and 10× the spacing between adjacent reflective layers 14), embodiments presented below are constructed on a different scale and thus operate according to a significantly different principle. For example, in some embodiments described below, the length of one side of a movable reflective layer is approximately the same as the spacing between adjacent movable reflective layers (e.g., a ratio of the length of one side of the movable reflective layer to the spacing between adjacent movable reflective layers is about 1:1). Due to the relative closeness of the dimensions, such a MEMS devices can modulate reflected light by modulating a phase difference between light reflected from a first (e.g., movable) portion and a second (e.g., stationary) portion of a reflective layer. In such MEMS devices, a modulated reflection spectrum dominantly results from optical interference between light reflected from the first portion and light reflected from the second portion. In certain embodiments, the first portion comprises a periodic array of structures that, when actuated to a certain depth, enhance an interference peak at a certain wavelength corresponding to the depth. The depth of the structures in the actuated state with respect to the second portion determines the color perceived by a viewer of the MEMS device.

Figure 8A:
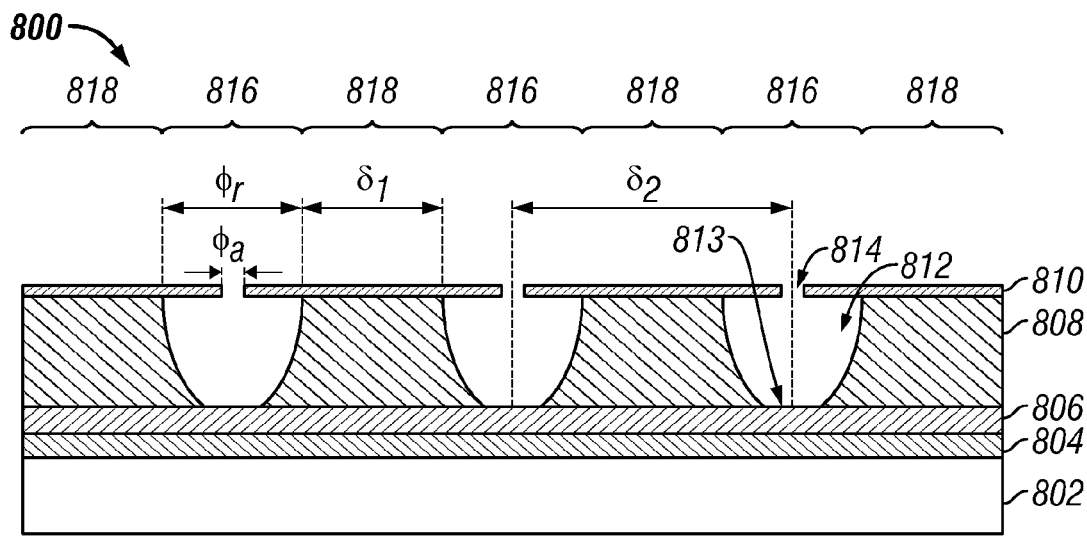
FIG. 8A is a cross section of an example embodiment of a MEMS device.
Figure 8B:
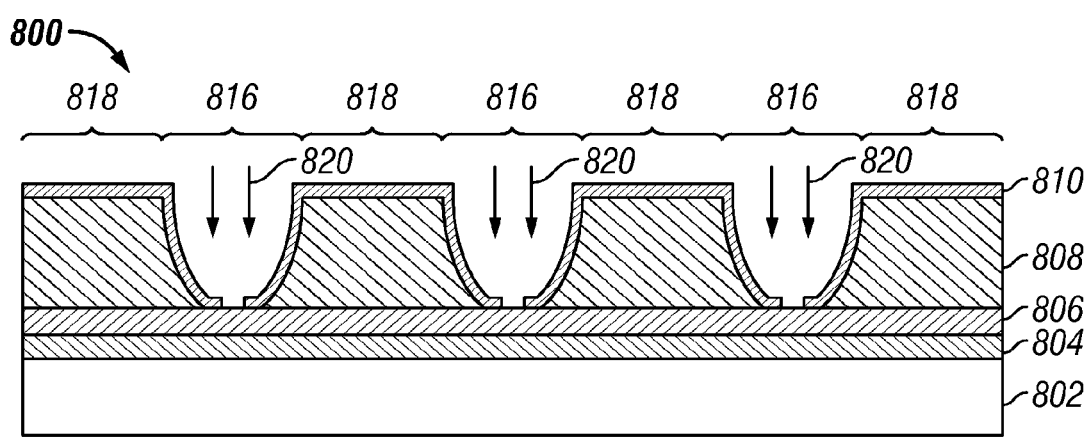
FIGS. 8B and 8C are cross sections of the MEMS device of FIG. 8B in an actuated position.

FIGS. 8A and 8B illustrate an example embodiment of a MEMS device 800 in which the reflectivity of the MEMS device 800 is dominantly modulated by changing a phase difference between light reflected from a first portion 816 and light reflected from a second portion 818 of a reflective layer 810. The MEMS device 800 comprises a substrate 802, an actuation electrode 804 over the substrate 802, a reflective layer 810 over the actuation electrode 804, and a support layer 808 between the actuation electrode 804 and the reflective layer 810. The reflective layer 810 includes at least one aperture 814 through the reflective layer 810. The support layer 808 includes a recess 812 below the aperture 814. The first portion 816 of the reflective layer 810 comprises the portion of the reflective layer 810 above a recess 812 and the second portion 818 of the reflective layer 810 comprises the portion of the reflective layer 810 that is not above a recess 812.

The substrate 802 may comprise a material that is at least partially transparent or translucent and at least partially reflective, such as plastic and glass, or a material that is opaque, such as silicon or stainless steel. The substrate 802 may also be fabricated into a variety of forms, including, but not limited to, a homogeneous substance or a non-homogenous substance, or having a uniform thickness or a non-uniform thickness. The substrate 802 may also have several sublayers.

The actuation electrode 804 comprises a conductive material and, in certain embodiments, is configured to receive a control signal. The actuation electrode 804 may comprise a material that is at least partially transparent and partially reflective, such as indium tin oxide (ITO), or a material that is opaque, such as aluminum, nickel, gold, silver, copper, or other materials.

The support layer 808 may comprise a material that is at least partially transparent and partially reflective, such as photoresist or other polymers, silicon oxide ($SiO_2$), or alumina ($Al_2O_3$), or a material that is opaque, such as molybdenum (Mo) or silicon (e.g., alpha silicon (α-Si)). In some embodiments in which the recess 812 extends through the support layer 808, the thickness of the support layer 808 can influence the depth to which the reflective layer 810 is deflected. In certain such embodiments, the support layer 808 has a thickness between about 100 and 150 nm.

The recesses 812 are wide enough to allow light to propagate into the structure and to reflect out of the structure. In certain embodiments, the depths of the recesses 812 are each on the order of a wavelength of light (e.g., less than about 1 μm). In certain embodiments, depths of the recesses 812 are each smaller than a wavelength of light (e.g., less than about 700 nanometers (nm)). In certain embodiments in which the recesses 812 are cylindrical, the diameter is greater than about one-half of the maximum wavelength of interest for device operation. In certain embodiments in which the recesses 812 are cylindrical, the diameter is approximately the same as a wavelength of interest.

The reflective layer 810 comprises a conductive material configured to receive a control signal. The reflective layer 810 may comprise a material that is fully reflective, such as aluminum, nickel, gold, silver, copper, or other materials. In certain embodiments, the reflective layer 810 is thick enough to fully reflect light and has the mechanical properties described above. In some embodiments, the reflective layer 810 comprises a dielectric layer. In some embodiments, the reflective layer 810 comprises a plurality of layers alternating between low indices of refraction and high indices of refraction. In certain such embodiments, one or more of the layers may include an implanted charge that allows the reflective layer 810 to be influenced by electrostatic forces.

In some embodiments, a ratio of an area of the first portion 816 to an area of the second portion 818 is about 1:1. For example, in embodiment in which the MEMS device 800 is square and comprises cylindrical recesses 812, the total area of the MEMS device 800 is the square of the length of a side, $s^2$. The area of the cylindrical recess 812, the first portion 816, is the area of a circular cross-section with diameter $\phi$, $\pi\phi^2/4$. The area remaining, the second portion 818 within the pixel, is $s^2-\pi\phi^2/4$. Thus, a ratio of the area of the first portion 816 to the area of the second portion 818 within the pixel, $\pi\phi^2/4:s^2-\pi\phi^2/4$, may be about 1:1. While a ratio of about 1:1 can desirably provide a good balance between contrast and color saturation, manufacturing tolerances may result in a ratio different from 1:1 (e.g., higher or lower than about 1:1). In embodiments in which a desaturated color and/or a reduced contrast ratio is acceptable, the ratio other than about 1:1 may be acceptable. Thus, in certain embodiments, a ratio of an area of the first portion 816 to an area of the second portion 818 is greater than about 1:1 or less than about 1:1.

In certain embodiments in which the recess 812 extends through the support layer 808, an electrically insulating layer 806 may be disposed between the reflective layer 810 and the actuation electrode 804. Upon actuation of the reflective layer 810 into the recess 812, the insulating layer 812 may reduce the probability (e.g., minimize, prevent) of a short forming between the reflective layer 810 and the actuation electrode 804. The insulating layer 806 may comprise $SiO_2$, $Al_2O_3$, other dielectric materials, combination thereof, and the like. In certain embodiments, the insulating layer 806 is disposed between the reflective layer 810 and the support layer 808. In certain embodiments, the reflective layer 810 comprises the insulating layer 806 underneath a relatively thin metallic layer.

The aperture 814 in the reflective layer 810 has a width $\phi_a$. In embodiments in which the aperture 814 is generally circular, the width $\phi_a$ is the diameter of the aperture 814. In certain embodiments, the width $\phi_a$ is between about 10 and 300 nm. The recess 812 in the support layer 808 has a width $\phi_r$. In embodiments in which the recess 812 is generally cylindrical, the width $\phi_r$ is the diameter of the cylinder. In certain embodiments, the width $\phi_r$ is between about 30 nm and 1 μm. In some embodiments, the width $\phi_r$ is on the order of a wavelength of light. In certain embodiments, a ratio of the width $\phi_a$ to the width $\phi_r$ is between about 1:100 and 1:2. In some embodiments, a ratio of the width $\phi_a$ to the width $\phi_r$ is about 1:3. Smaller widths $\phi_r$ allow the reflective layer 810 to reflect more light, resulting in better device performance (i.e., the ideal width $\phi_r$ is zero, but that the width $\phi_r$ may need to be a certain size to suitably remove a portion of the support structure 808 therethrough, as described below). In certain embodiments comprising a plurality of recesses 812, adjacent recesses 812 have an edge-to-edge distance $\delta_1$ less than about 1 μm. In some embodiments comprising a plurality of recesses 812, adjacent recesses 812 have an edge-to-edge distance $\delta_1$, which is on the order of a wavelength of light. In certain embodiments comprising a plurality of apertures 814 and a plurality of recesses 812 below the apertures 814, the recesses 812 have a center-to-center distance $\delta_2$ less than about 2 μm.

Upon application of a control signal to the MEMS device 800 (e.g., a voltage difference between the actuation electrode 804 and the reflective layer 810), at least the first portion 816 of the reflective layer 810 is configured to move into the recess 812 and at least the second portion 818 of the reflective layer 810 is configured to remain stationary. In certain embodiments, the first portion 816 of the reflective layer 810 comprises the portion of the reflective layer 810 above the recess 812 and a second portion 818 of the reflective layer 810 comprises the portion of the reflective layer 810 that is not above a recess 812. FIG. 8A illustrates the MEMS device 800 in an unactuated or "relaxed" state and FIG. 8B illustrates the MEMS device 800 in an actuated state. Upon application of a control signal, the first portion 816 of the reflective layer 810 is deflected towards the actuation electrode 804, as indicated by the arrows 820.

Figure 8C:
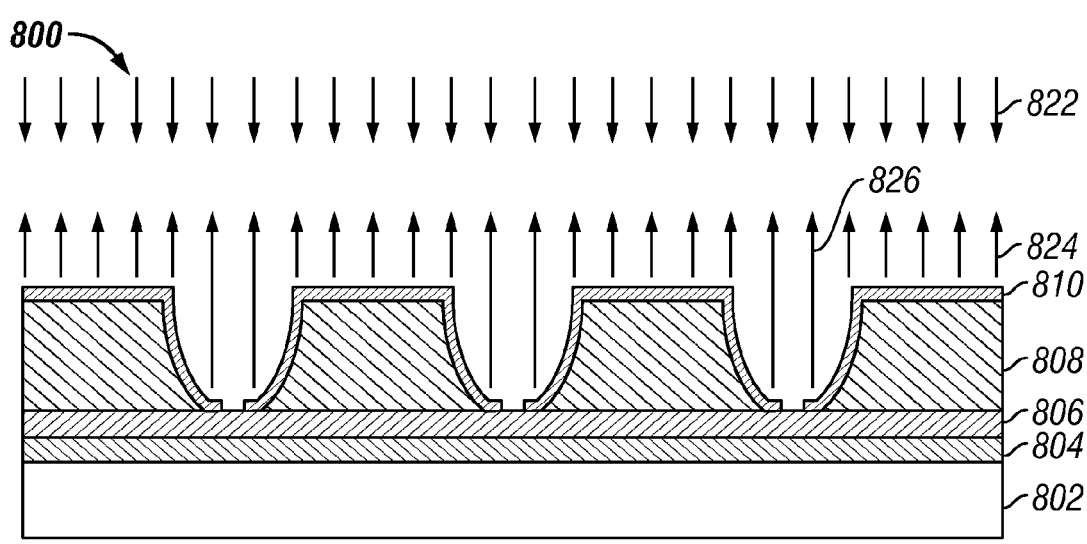

FIG. 8C illustrates a diagram of light rays incident on the MEMS device 800 in the actuated state. Light 822 propagates towards the reflective layer 810 from an ambient light source (e.g., the sun, a light bulb) or from an internal light source (e.g., a light panel). Portions of the light 824 are reflected from the second portion 818 of the reflective layer 810 and portions of the light 826 are reflected from the first portion 816 of the reflective layer 810 within the recesses 812. Due to the differing light path lengths, the light 826 reflected from the first portion 816 and the light 824 reflected from the second portion 818 thus have different phases, and, as described above, the phase difference can create optical interference. The interferometric characteristics of the MEMS device 800 is therefore dominantly modulated by changing a phase difference between light reflected from the first portion 816 and light reflected from the second portion 818. By contrast, if the recess 812 was large compared to the space $\delta_1$ between adjacent recesses 812, the result would be imperceptible colored rings around the edge of the recess 812 and white light everywhere else. In certain embodiments, the interferometric characteristics of the MEMS device 800 is changeable between a zero phase difference (e.g., from the unactuated or "relaxed" state, as illustrated in FIG. 8A) and a non-zero phase difference (e.g., from the fully actuated state, as illustrated in FIGS. 8B and 8C). In some embodiments provided herein, the reflective layer 810 can be controlled in an analog fashion to provide various states of partial actuation between the unactuated state and the fully actuated state.

FIG. 8C illustrates a MEMS device 800 that is operably viewable from a side of the reflective layer 810 opposite the actuation electrode 804. In certain embodiments in which the substrate 802, the actuation electrode 804, and the support layer 808 comprise materials that are at least partially transparent, the device 800 is operably viewable through the actuation electrode 804 because light reflected from the same side of the reflective layer 810 as the actuation electrode 804 also experiences a phase shift, for example directly opposite to the effect illustrated in FIG. 8C (i.e., as the substrate 802 is oriented in FIG. 8C, where light is incident from the bottom of the substrate 802). In certain such embodiments, the device 800 is operably viewable from either side of the reflective layer 810 (i.e., through the substrate 802, the actuation electrode 804, and the support layer 808 and from a side of the reflective layer 810 opposite the actuation electrode 804).

Figure 9A:
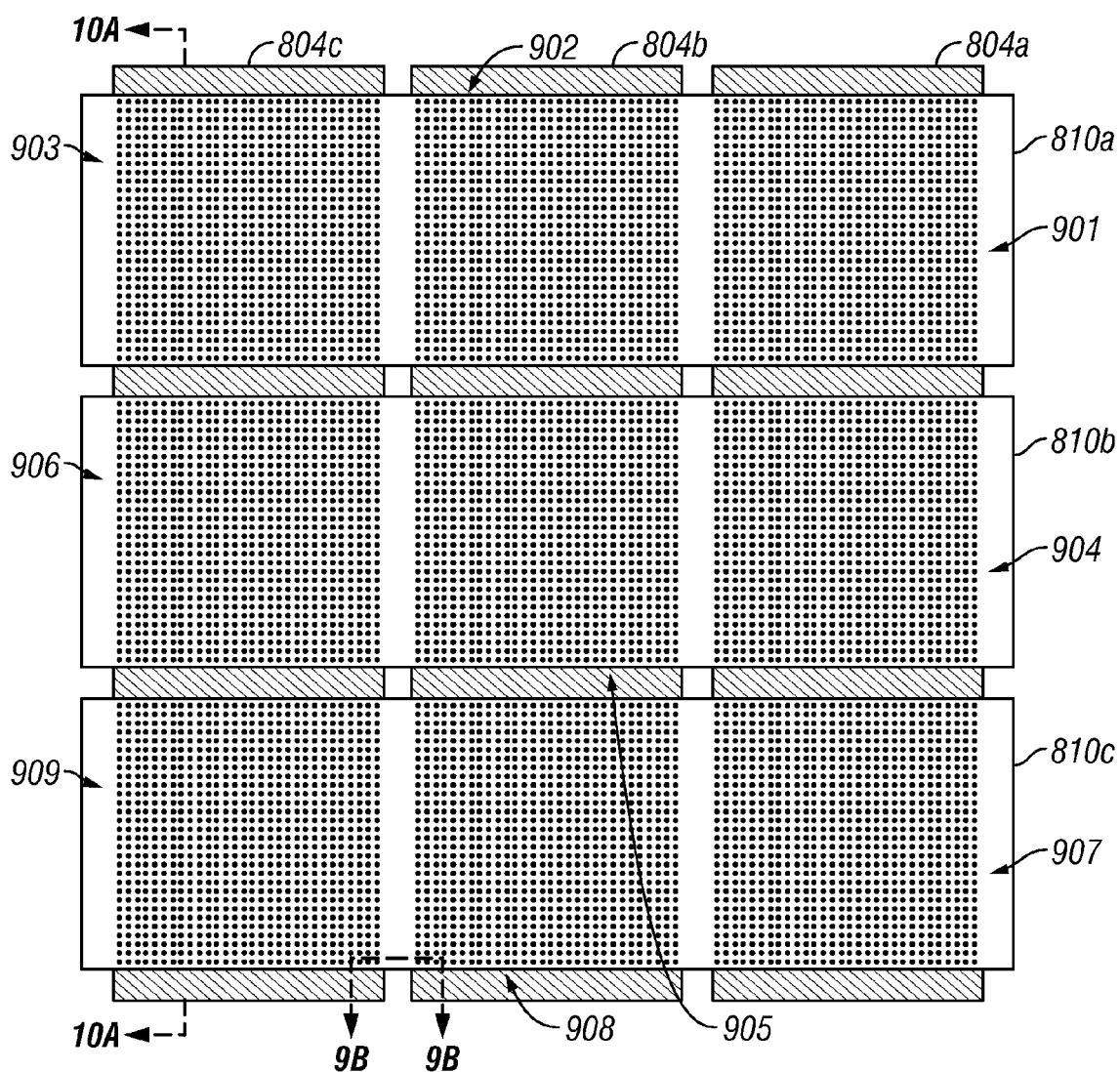
FIG. 9A is a top plan view of an example embodiment of a 3×3 array of MEMS devices of FIG. 8A.

In certain embodiments, the reflective layer 810 includes a plurality of apertures 814 through the reflective layer 810 and the support layer 808 includes a recess 812 below each of the plurality of apertures 814 (e.g., as illustrated in FIG. 8A). Upon application of a control signal to the MEMS device 800 (e.g., a voltage difference between the actuation electrode 804 and the reflective layer 810), the first portion 816 of the reflective layer 810 is configured to move into the recess 812 and the second portion 818 of the reflective layer 810 is configured to remain stationary. In certain embodiments, the recesses 812 are in a pattern that is periodic in two dimensions (e.g., as illustrated in FIG. 9A and described below) across the support layer 808.

Figure 8D:
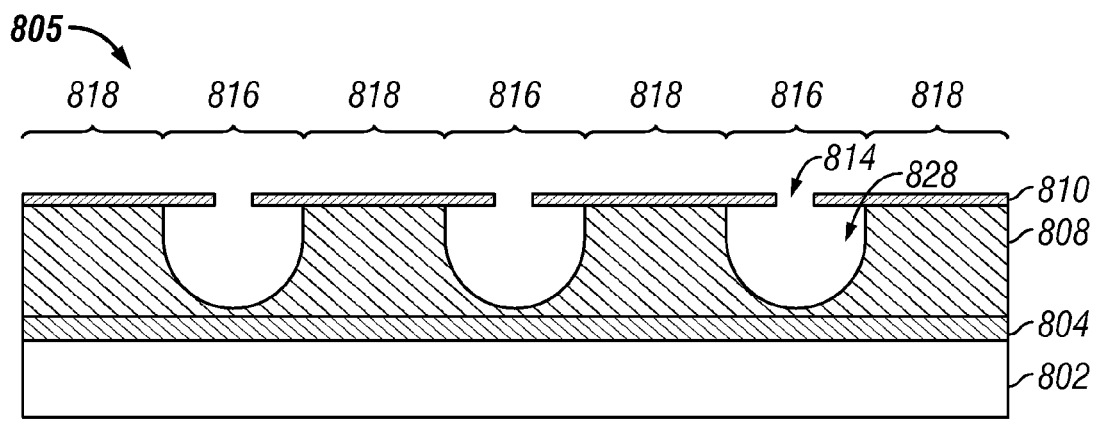
FIG. 8D is a cross section of another example embodiment of a MEMS device.

FIG. 8D illustrates another example embodiment of a MEMS device 805 comprising a substrate 802, an actuation electrode 804 over the substrate 802, a reflective layer 810 over the actuation electrode 804, and a support layer 808 between the actuation electrode 804 and the reflective layer 810. The reflective layer 810 includes at least one aperture 814 through the reflective layer 810. The support layer 808 includes a recess 828 between the actuation electrode 804 and the at least one aperture 814. Unlike the recess 812 illustrated in FIG. 8A, the recess 828 does not extend completely through the support layer 808.

Figure 8E:
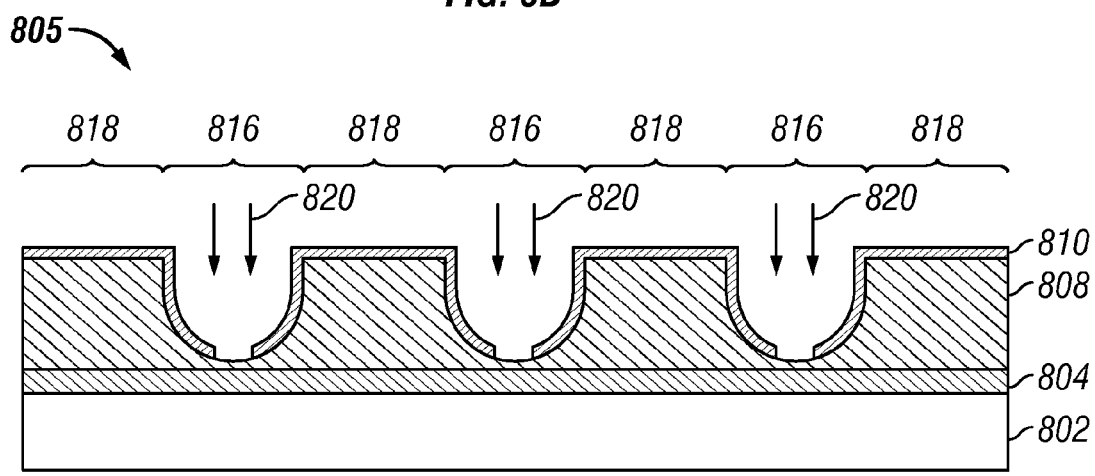
FIGS. 8E and 8F are cross sections of the MEMS device of FIG. 8D in an actuated position.

Upon application of a control signal to the MEMS device 805 (e.g., a voltage difference between the actuation electrode 804 and the reflective layer 810), at least a first portion 816 of the reflective layer 810 moves into the recess 812 and at least a second portion 818 of the reflective layer 810 remains stationary. The first portion 816 of the reflective layer 810 comprises the portion of the reflective layer 810 above a recess 812 and the second portion 818 of the reflective layer 810 comprises the portion of the reflective layer 810 that is not above a recess 812. FIG. 8E illustrates the MEMS device 805 in an actuated state. Upon application of a control signal, the first portion 816 of the reflective layer 810 is deflected towards the actuation electrode 804, as indicated by the arrows 820. Because the recess 824 does not extend through the support layer 808, the support layer 808 remaining between the recess 824 and actuation electrode 804 may act as an electrical insulating layer.

Figure 8F:
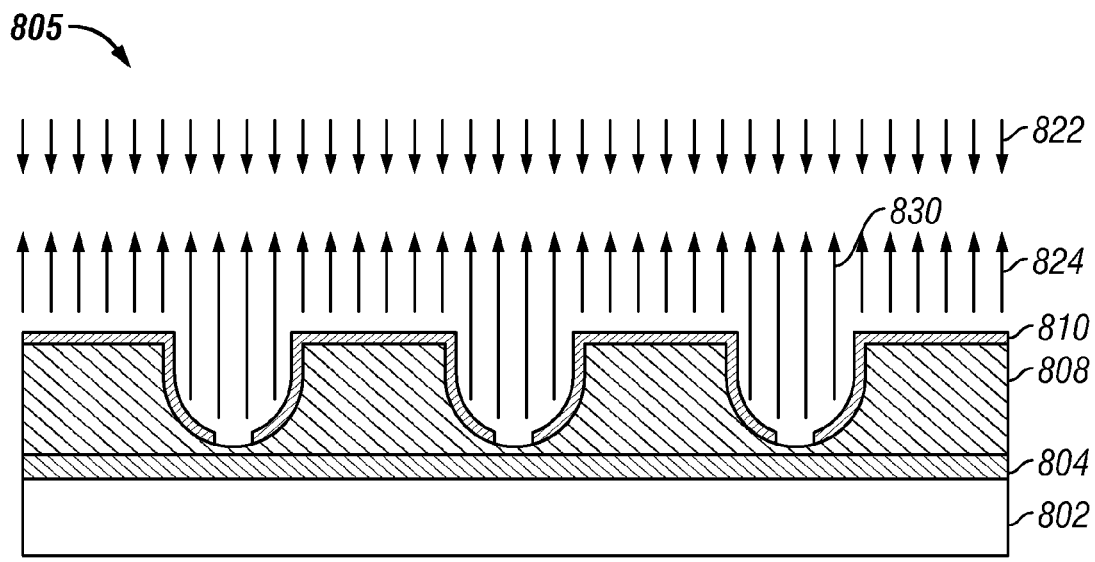

FIG. 8F illustrates a diagram of light incident on the MEMS device 805 in the actuated state. Light 822 propagates towards the reflective layer 810 from an ambient light source (e.g., the sun, a light bulb) or from an internal light source (e.g., a light panel). Portions of the light 824 are reflected from the second portion 818 of the reflective layer 810 and portions of the light 830 are reflected from the first portion 816 of the reflective layer 810 within the recesses 812. Due to the differing light paths, the light 824 reflected from the first portion 816 and the light reflected from the second portion 818 thus have different phases, and, as described above, the phase difference creates optical interference. The reflectivity of the MEMS device 805 is therefore dominantly modulated by changing a phase difference between light reflected from the first portion 816 and the second portion 818. In certain embodiments, the reflectivity of the MEMS device 800 is changeable between a zero phase difference (e.g., as illustrated in FIG. 8D) and a non-zero phase difference (e.g., as illustrated in FIG. 8E).

In the MEMS device 800 shown in FIGS. 8A-8C, the recess 812 is at least partially bounded by a substantially flat surface 813. Substantially all of the light 826 reflected from the first portion 816 has similar (e.g., substantially similar) phases. Certain such embodiments provide uniform (e.g., substantially uniform) color when the MEMS device 800 is in the actuated state. In embodiments in which the recess is not at least partially bounded by a substantially flat surface (e.g., the MEMS device 805), the light 830 reflected from various parts of the first portion 816 may have different phases depending on the level of curvature of the reflective surface 810 in the actuated state. Thus, certain such embodiments do not provide substantially uniform color. However, certain such embodiments may advantageously allow the elimination of an insulating layer 806. It will be appreciated that the recess 828 of the MEMS device 805 may also be at least partially bounded by a substantially flat surface.

FIG. 9A is a top plan view of a MEMS device 900 comprising a 3×3 array of MEMS devices (e.g., the MEMS device 800, the MEMS device 805). The reflective layer 810 comprises a plurality of generally parallel portions 810a, 810b, 810c extending along a first direction across the device 900. The actuation electrode 804 comprises a plurality of generally parallel portions 804a, 804b, 804c extending along a second direction of the device 900. The first direction is substantially non-parallel to the second direction. In certain embodiments, the first direction is substantially perpendicular to the second direction (e.g., as illustrated in FIG. 9A). Areas of overlap between the generally parallel portions 810a, 810b, 810c of the reflective layer 810 and the generally parallel portions 804a, 804b, 804c of the actuation electrode 804 comprise pixels 901 (overlap of portion 810a and portion 804a), 902 (overlap of portion 810a and portion 804b), 903 (overlap of portion 810a and portion 804c), 904 (overlap of portion 810b and portion 804a), 905 (overlap of portion 810b and portion 804b), 906 (overlap of portion 810b and portion 804c), 907 (overlap of portion 810c and portion 804a), 908 (overlap of portion 810c and portion 804b), 909 (overlap of portion 810a and portion 804c). In certain embodiments, the generally parallel portions 810a, 810b, 810c of the reflective layer 810 comprise stripes and the generally parallel portions 804a, 804b, 804c of the actuation electrode 802 comprise stripes.

Within each pixel 901-909, the reflective layer 810 comprises a plurality of apertures 814 and the support layer 808 comprises a plurality of recesses 812 between the actuation electrode 804 and the apertures 814. In certain embodiments, each pixel comprises at least 1, at least 10, at least 100, at least 1,000, at least 10,000, or more recesses 812 depending on the width $\phi_r$ of the recesses 812 and the size of the pixel. The apertures 814, and thus the recesses 812, can have a periodic distribution in two dimensions. For example, as illustrated in FIG. 9A, the apertures 814 are evenly distributed in the first direction and are evenly distributed in the second direction. In certain embodiments, rows of apertures 814 may be offset with respect to each other. In some alternative embodiments, the apertures 814, and thus the recesses 812, are not periodic, but are randomly distributed. The reflectivity of such a MEMS device may still be dominantly modulated if the area of the first portion 816 (configured to move into the recesses 814 upon application of a control signal) to the second portion 818 (configured to remain stationary upon application of a control signal) may be about 1:1.

As described above, an actuation protocol that applies a control signal to the MEMS device 900 (e.g., a voltage difference between the columns of the actuation electrode 804 and the rows of the reflective layer 810) can be used to selectively actuate certain pixels 901-909. For example, creating a voltage difference between the actuation electrode portion 804a and the reflective layer portion 810a can cause the pixel 901 to be actuated while the pixels 902, 903 comprising the reflective layer portion 810a and the pixels 904, 907 comprising the actuation electrode portion 804a would not be actuated absent application of the voltage to reflective layers 810b and 810c. It will be appreciated that in some embodiments the actuation electrode portions are columns and the reflective layer portions are rows.

Figure 9B:
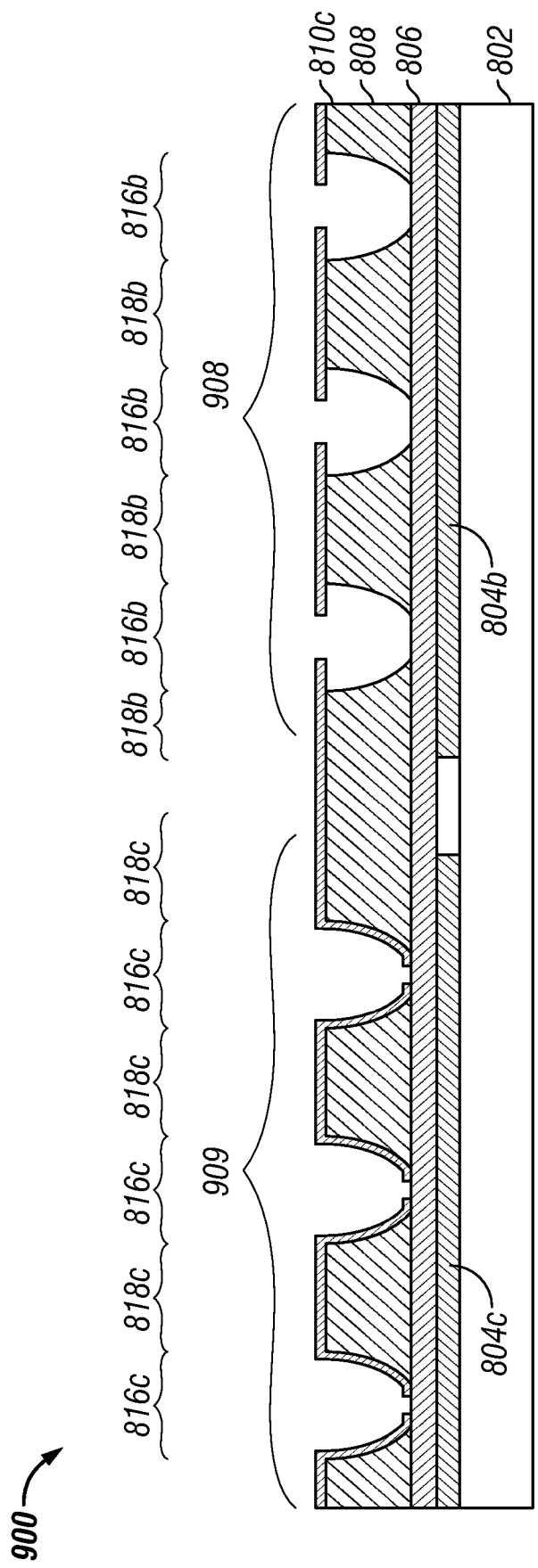
FIG. 9B is a cross section of a portion of two MEMS devices taken along line 9B-9B of FIG. 9A.

FIG. 9B is a cross-sectional view of the MEMS device 900 taken along the line 9B-9B of FIG. 9A. The support layer 808 comprises a plurality of recesses 812 between the reflective layer 810c of each pixel 908, 909 and the actuation electrode 804b, 804c of each pixel 908, 909, respectively. In FIG. 9B, a control signal has been applied between the reflective layer 810c and the actuation electrode 804c, but no control signal has been applied between the actuation electrode 804b and the reflective layer 810b. Accordingly, the first portion 816c of the reflective layer 804c in the pixel 909 is actuated while the second portion 818c of the reflective layer 804c in the pixel 909 remains stationary, and the first portion 816b of the reflective layer 804b in the pixel 908 is not actuated while the second portion 818b of the reflective layer 804b in the pixel 908 remains stationary. Selective actuation of pixels in an array can be used to produce an image, as described above.

Figure 10A:
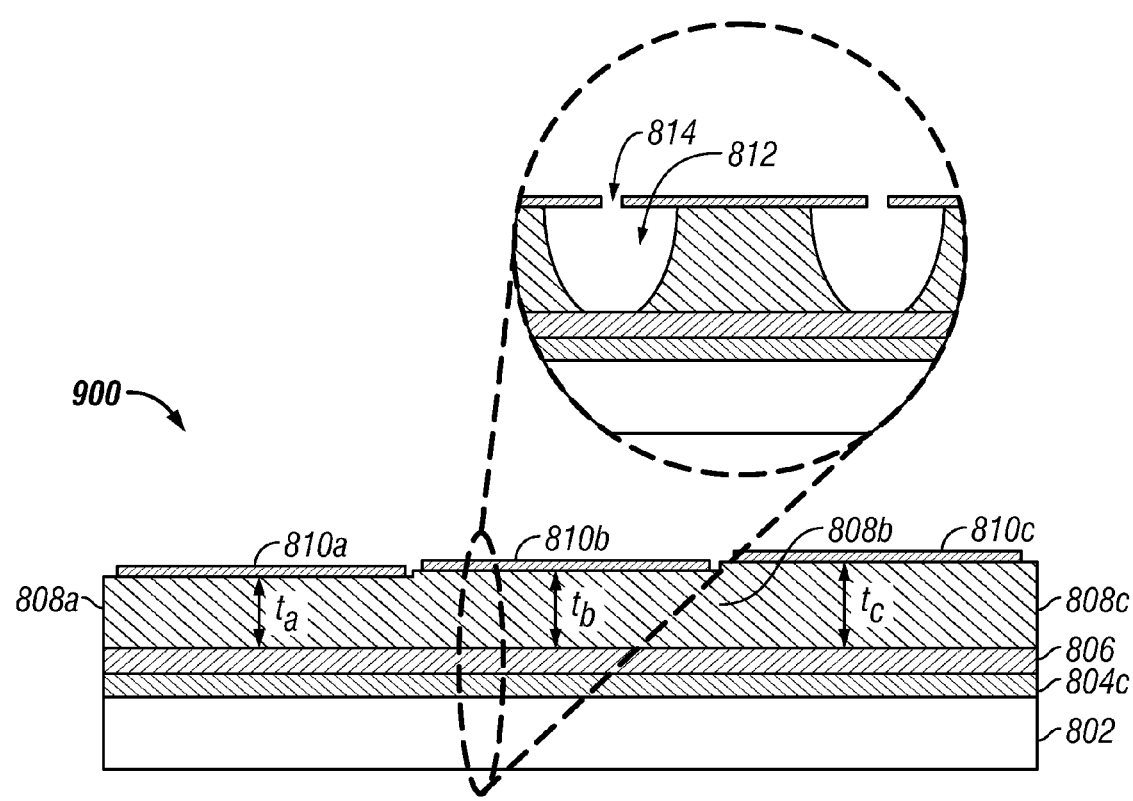
FIG. 10A is a cross section of an example embodiment of a plurality of MEMS devices taken along the line 10A-10A of FIG. 9A.

FIG. 10A illustrates a cross-sectional view of an example embodiment of the MEMS device 900 taken along line 10A-10A of FIG. 9A. In each pixel, the reflective layer portion 810a, 810b, 810c comprises at least one aperture 814 and the support layer 808 comprises a recess 812 between the actuation electrode portion 804a, 804b, 804c and each aperture 814. The expanded view within the dashed circle of FIG. 10A illustrates that the MEMS devices within each pixel may be similar to that described above for the MEMS device 800 of FIG. 8A, in which the reflective layer 810 comprises a plurality of apertures 814 and in which the support layer 808 comprises a plurality of recesses 812 between the actuation electrode 804 and the apertures 814.

The support layer 808 comprises a plurality of support structure portions: a first support structure portion 808a is beneath the reflective layer portion 810a and has a thickness $t_a$; a second support structure portion 808b is beneath the second reflective layer portion 810b and has a thickness $t_b$; and a third support structure portion 808c is beneath the third reflective layer portion 810c and has a thickness $t_c$. In certain embodiments, the thicknesses $t_a$, $t_b$, $t_c$ of the support structures portions 808a, 808b, 808c, respectively, are different from one another (e.g., as illustrated in FIGS. 10A and 10B).

In a relaxed state, light reflected from the reflective surfaces 810a, 810b, 810c appears substantially the same to a viewer (i.e., as broadband white). In an actuated state, in which the first portion of the reflective layer 810a, 810b, and/or 810c deflects into the recesses 812, the color perceived by a viewer is modulated. In certain embodiments, the recesses 812 in each of the support structure portions 808a, 808b, 808c extend through the support structure portions 808a, 808b, 808c (e.g., as described above for FIG. 8A). In certain such embodiments, the thicknesses of the support structure portions 808a, 808b, 808c influence the colors perceived by a viewer of the MEMS device 900 in an actuated state. In certain embodiments, the recesses 812 in each of support structure portions 808a, 808b, 808c extend to the same depth into the support structure portions 808a, 808b, 808c, regardless of the thickness $t_a$, $t_b$, $t_c$ of the support structure portion 808a, 808b, 808c (i.e., the recesses 812 extend through the support layer 808 in no more than one of the support structure portions 808a, 808b, 808c). In certain such embodiments, the difference in heights of the support structure portions 808a, 808b, 808c influences the colors perceived by a viewer of the MEMS device 900 in an actuated state. In certain embodiments, the apertures 812 in each of the support structure portions 808a, 808b, 808c extend different depths into the support structure portions 808a, 808b, 808c. In certain such embodiments, the thicknesses of the support structure portions 808a, 808b, 808c and the difference in heights of the support structure portions 808a, 808b, 808c influence the colors perceived by a viewer of the MEMS device 900 in an actuated state. Regardless of the precise recess design, it will be therefore appreciated that varying support structure portion thicknesses and/or recess depths can be used to produce a plurality of colors, and thus a full color display device.

Figure 10B:
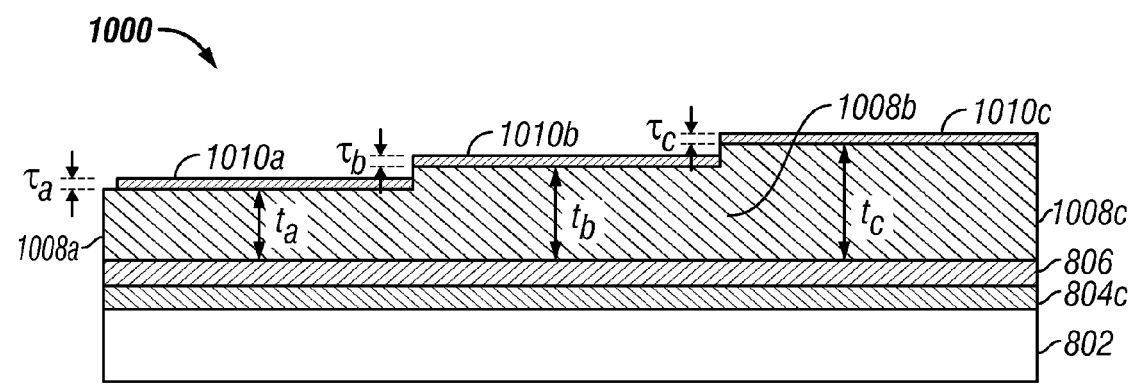
FIG. 10B is a cross section of a yet another example embodiment of a plurality of MEMS devices.

FIG. 10B illustrates an example embodiment of a MEMS device 1000 comprising reflective layer portions 1010a, 1010b, 1010c, actuation electrode portions 804a (see FIG. 9A), 804b (see FIG. 9A), 804c, and support structure portions 1008a, 1008b, 1008c having thicknesses $t_a$, $t_b$, $t_c$, respectively. Areas of overlap between the reflective layer portions 1010a, 1010b, 1010c and the actuation electrode portions 804a, 804b, 804c comprise pixels. In each pixel, the reflective layer portion 1010a, 1010b, 1010c comprises at least one aperture 814 and the support structure portion 808a, 808b, 808c comprises a recess 812 between the actuation electrode portion 804a, 804b, 804c and each aperture 814 (see expanded view within FIG. 10A).

In the MEMS device 1000, a difference between the first thickness $t_a$ and the second thickness $t_b$ is greater than the thickness 1a of the reflective layer portion 1010a and the difference between the thickness $t_b$ and the thickness $t_c$ is greater than the thickness $\tau_b$ of the reflective layer portion 1101b. A difference between the first thickness $t_a$ and the third thickness $t_c$ may also be greater than the thickness $\tau_a$ of the reflective layer portion 1010a and/or the thickness $\tau_c$ of the reflective layer portion 1010c. In certain embodiments, poor step coverage of a deposition process used to create the reflective layer portions 1010a, 1010b, 1010c may be advantageously used to define a boundary between the reflective layer portions 1010a, 1010b, 1010c. Spaces between pixels, for example due to spaces between generally parallel portions of actuation electrodes and/or generally parallel portions of reflective layers can decrease the contrast of reflective MEMS devices. Thus, reducing or eliminating the amount of space between generally parallel portions of the reflective layer can increase the contrast of the device.

Figure 11A:
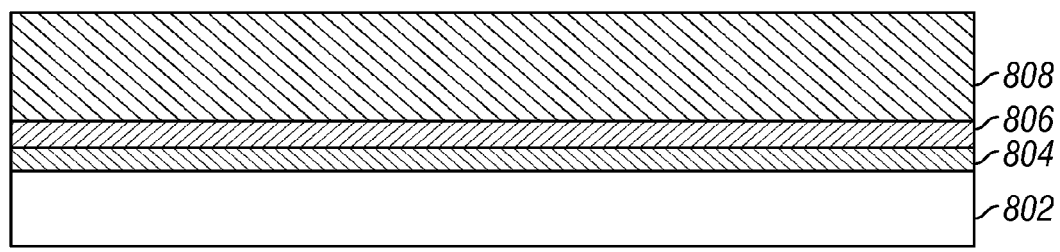
FIGS. 11A-11E are cross sections of an example embodiment of a method of fabricating the MEMS device of FIG. 8A.

FIGS. 11A through 11E illustrate an example embodiment of a method of manufacturing a MEMS device 800. FIG. 11A illustrates a structure 1100 in which an actuation electrode 804 is formed over a substrate 802. In certain embodiments, forming the actuation electrode 804 comprises forming a plurality of generally parallel portions (e.g., as illustrated in FIG. 9A). As described above, in certain embodiments, an electrically insulating layer 806 may optionally be formed over the actuation electrode 804. The structure 1100 in FIG. 11A further illustrates a support layer 808 formed over the actuation electrode 804, and in embodiments in which the MEMS device 800 comprises an insulating layer 806, over the insulating layer 806. In certain embodiments, forming the support layer 808 comprises forming a plurality of support structure portions (e.g., as illustrated in FIGS. 10A and 10B).

Figure 11B:
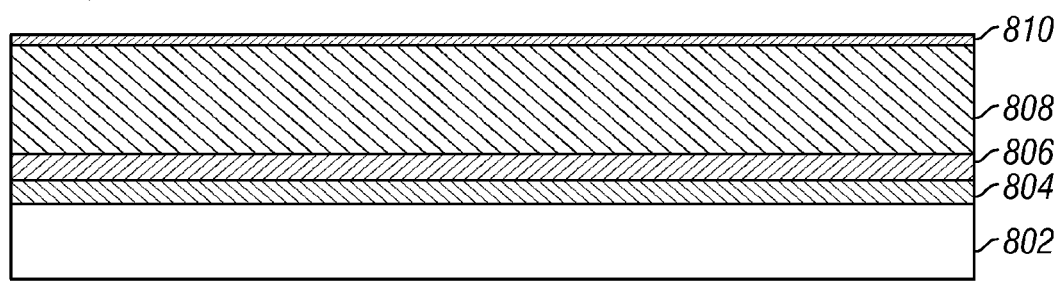
Figure 11C:
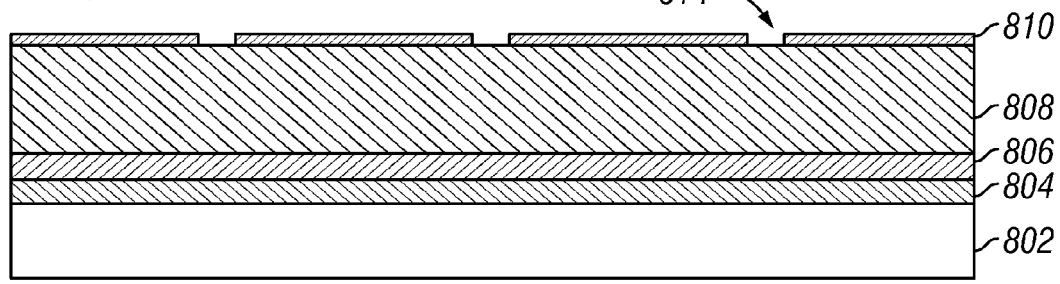

FIG. 11B illustrates the structure 1100 of FIG. 11A after a reflective layer 810 has been formed over the support layer 808. In certain embodiments, forming the reflective layer 810 comprises forming a plurality of generally parallel portions (e.g., as illustrated in FIG. 9A). As illustrated in FIG. 11C, at least one aperture 814 is then formed in the reflective layer 810. In certain embodiments, forming the at least one aperture 814 comprises milling with a focused ion beam (FIB). In certain embodiments, the aperture 814 is formed using other patterning techniques such as photolithography, lift-off processes, or the like.

Figure 11D:
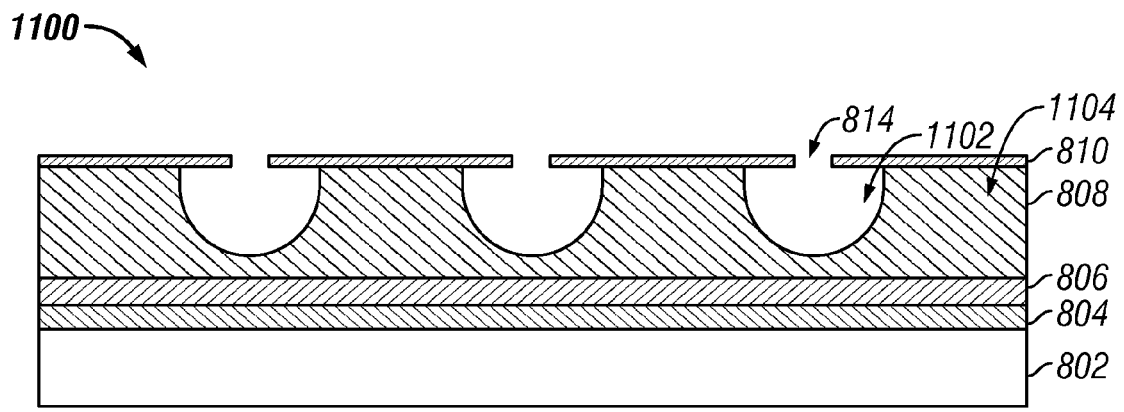
Figure 11E:
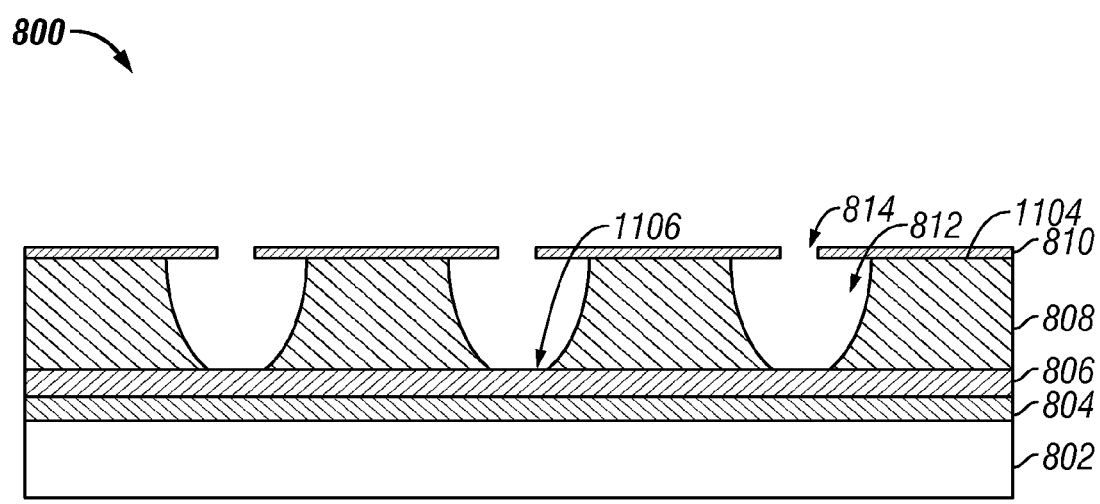

FIG. 11D illustrates the structure 1100 after a first portion 1102 of the support layer 808 is removed from a volume 1102 while a second portion 1104 of the support layer 808 remains. In certain embodiments, removing the first portion of the support layer 808 comprises introducing a reactant to the support layer 808 through the aperture 814. In some embodiments, forming the recess in the support layer 808 stops before the volume 1102 previously occupied by the first portion extends through the support layer 808, for example to form the recess 828 described above (e.g., stopping in the state illustrated in FIG. 11D). FIG. 11E illustrates the structure 800 after the first portion has been further removed until the recess 812 extends through the support layer 808.

In embodiments in which the reactant comprises a wet etchant, the first portion may be removed isotropically. In certain such embodiments, the width of the volume 1102 previously occupied by the first portion is larger than a width of the aperture 814. Longer reaction times generally lead to more removal of the first portion, which generally results in larger recesses 812, 828. In certain embodiments, a quenching material (e.g., comprising inert material) is used to stop the reaction. In certain embodiments, the reactant is at least partially selective between the material of the support layer 808 and the material of the insulating layer 806. In certain such embodiments, the reaction may substantially stop at the insulating layer 806 such that the recess 812 is bounded at least in part by a substantially flat portion (e.g., the recess bottom 1106). In certain embodiments, a recess 812 comprising a flat bottom 1106 has increased saturation over a recess 828 having a rounded, for example because light reflected from a reflective layer deflected into a recess at least partially bounded by a flat portion has a more uniform phase modulation than light reflected from a reflective layer deflected into a recess not at least partially bounded by a flat portion.

In certain embodiments, the support layer 808 comprises material with varying properties across its thickness. For example, the material of the support layer 808 may become easier or more difficult to etch across its thickness such that the profile of the recesses 812 may change within a single removal step. For example, the rate of removal may increase or decrease through the thickness of the support layer 808, thereby creating different profiles. In certain such embodiments, the support layer 808 comprises a plurality of materials, for example a layer of α-Si over a layer of Si.

Upon completion of the reaction that removes the first portion of the support layer 808, the MEMS device 800 is in an operable state because a control signal may be applied to the actuation electrode 804 that would cause a portion of the reflective layer 810 to move into volume 1102 previously occupied by the removed first portion. Accordingly, the MEMS device 800 is configured to be operated with the second portion 1104 of the support layer 808 remaining and supporting the non-moving second portion 818 (FIG. 8A) of the reflective layer 810. It will be appreciated that the structure 1100 may also be in an operable state because a control signal may be applied to the actuation electrode 804 that would cause a portion of the reflective layer 810 to move into the volume 1102 previously occupied by the removed first portion. After removal of the first portion 1102, the reflectivity of the MEMS device 800 is dominantly modulated by changing a phase difference between light reflected from the first portion 816 and light reflected from the second portion 818 (FIG. 8A).

Fabrication of the MEMS device 800 may advantageously omit certain steps typically used to create the device illustrated in FIG. 1. For example, the support layer 808 can support the reflective layer 810 in spaced relation to the actuation electrode 804 such that the patterning steps used to create post 18 are not needed. Additionally, because the modulation of reflectivity is dominated by the phase shift of light reflected by the first portion 816 relative to the light reflected by the second portion 818 of the reflective layer 810, the partially reflective layer in the optical stack 16 would not need to be deposited. For another example, the support layer 808 may electrically insulate the reflective layer 810 from the actuation electrode 804 in an actuated state such that the insulating layer 806 would not need to be deposited. The cleaning and metrology steps associated with such processes may advantageously also be eliminated. Other processes may be eliminated or added, as well, and some process steps may be rearranged.

In certain alternative embodiments, the MEMS device 800 may be manufactured by forming a sacrificial layer within the support layer 808 (e.g., in the area configured to become a recess 812), forming the reflective layer 810 over the sacrificial layer and the support layer 808, forming at least one aperture in the reflective layer 810 over the sacrificial layer, and removing the sacrificial layer to form a recess 812 between the actuation electrode and the at least one aperture. In certain such embodiments, the reactant used to remove the sacrificial layer may be selective to the support structure 808. Such embodiments may allow increased control over the dimensions of the recesses 812, but may also increase the number of process steps.

Figure 12A:
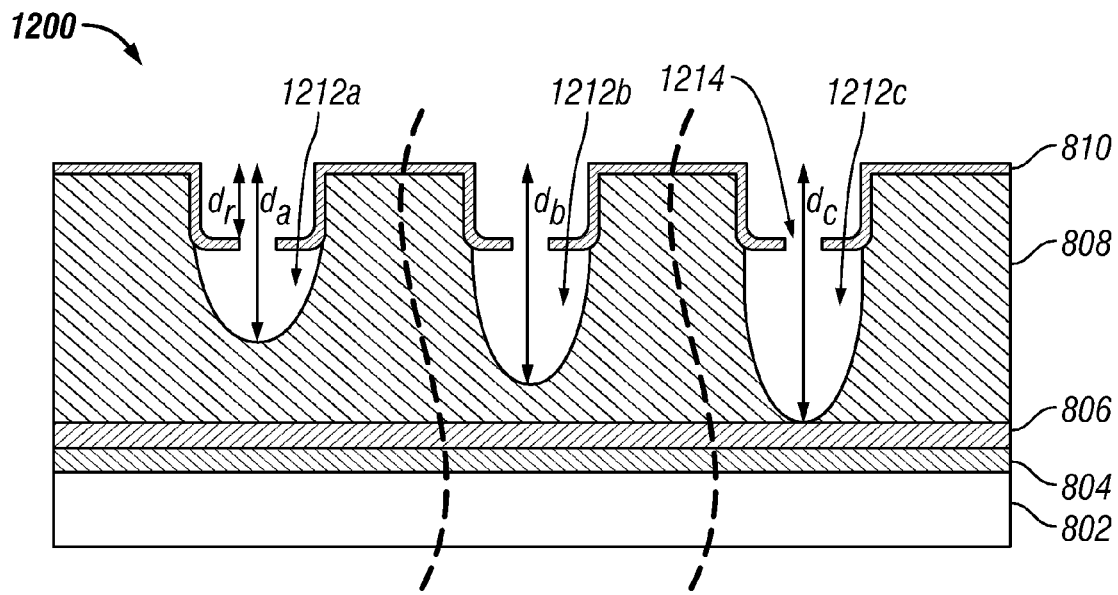
FIG. 12A is a cross section of an example embodiment of a plurality of MEMS devices.

FIG. 12A illustrates another example embodiment of a MEMS device 1200 comprising a substrate 802, an actuation electrode 804 over the substrate 802, a reflective layer 810 over the actuation electrode 804, and a support layer 808 between the actuation electrode 804 and the reflective layer 810. The MEMS device 1200 comprises three pixels, as separated by the dashed lines. The reflective layer 810 includes at least one aperture through the reflective layer 810. The support structure portions for each pixel have the same height, and the reflective layer 810 is spaced from the actuation electrode 804 by the same amount in each pixel. However, unlike the MEMS device 800 illustrated in FIG. 8A and the MEMS device 805 illustrated in FIG. 8B, a first pixel comprises the support layer 808 having a plurality of recesses 1212a having a depth $d_a$, a second pixel comprises the support layer 808 having a plurality of recesses 1212b having a depth $d_b$, and a third pixel comprises the support layer 808 comprising a plurality of recesses 1212c having a depth $d_c$.

In the relaxed state of FIG. 12A, a portion of the reflective layer is at a depth $d_r$ within the recesses 1212a, 1212b, 1212c. In certain such embodiments, a viewer of the MEMS device 1200 perceives a color influenced by the depth $d_r$ in the relaxed state. For example, a depth $d_r$ of about 130 nm may produce a color approximating black (e.g., deep violet or near ultraviolet).

Figure 12B:
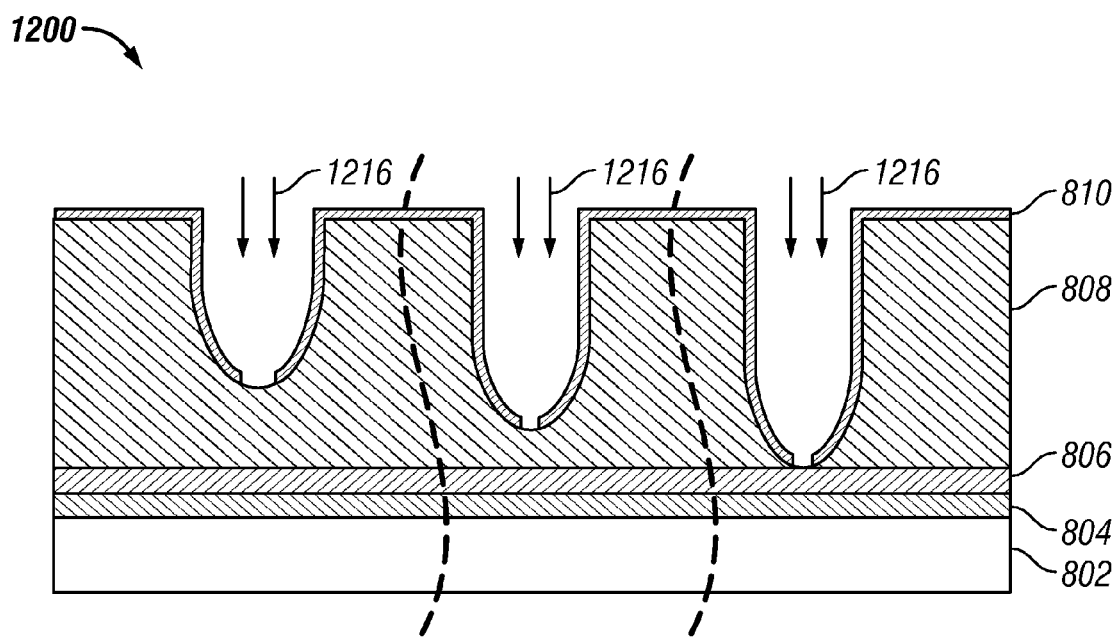
FIG. 12B is a cross sections of the MEMS device of FIG. 12A in an actuated position.

FIG. 12B illustrates the MEMS device 1200 in which the reflective layer 810 is deflected into the recesses 1212a, 1212b, 1212c in each of the pixels is an the actuated state, as indicated by the arrows 1216. The differences in the depths $d_a$, $d_b$, $d_c$ of the recesses 1212a, 1212b, 1212c, respectively, can cause light reflected from the reflective layer 810 to be modulated differently in each pixel, for example due to different phase shifts, thereby causing a user to see a different color of reflected light from each pixel. As an example, the depth $d_a$ may be about 230 nm for blue, the depth $d_b$ may be about 260 nm for green, and the depth $d_c$ may be about 310 nm for red. A wide variety of colors are possible. In general, the color of a pixel is $N\lambda/2$, where N is an integer representing the "order" of light (i.e., where N=1 for first order light, N=2 for second order light, etc.) and λ is the wavelength. First order colors (i.e., when N=1) are brighter, but higher order colors (i.e., N>1) tend to be more saturated. Thus, a depth $d_a$ of 230 nm could produce first order blue because 1*460 nm/2=230 nm, a depth $d_b$ of 260 nm could produce first order green because 1*520 nm/2=260 nm, and a depth $d_c$ of 310 nm could produce first order red because 1*620 nm/2=310 nm. Combinations of orders are also possible among the various pixels (e.g., first order blue and red and second order green). Additionally, combinations with other MEMS devices described herein are also possible. Foe example, the reflective layer 810 may be at a depth $d_r$ in each of the support structure portions 808a, 808b, 808c described above.

Figure 13A:
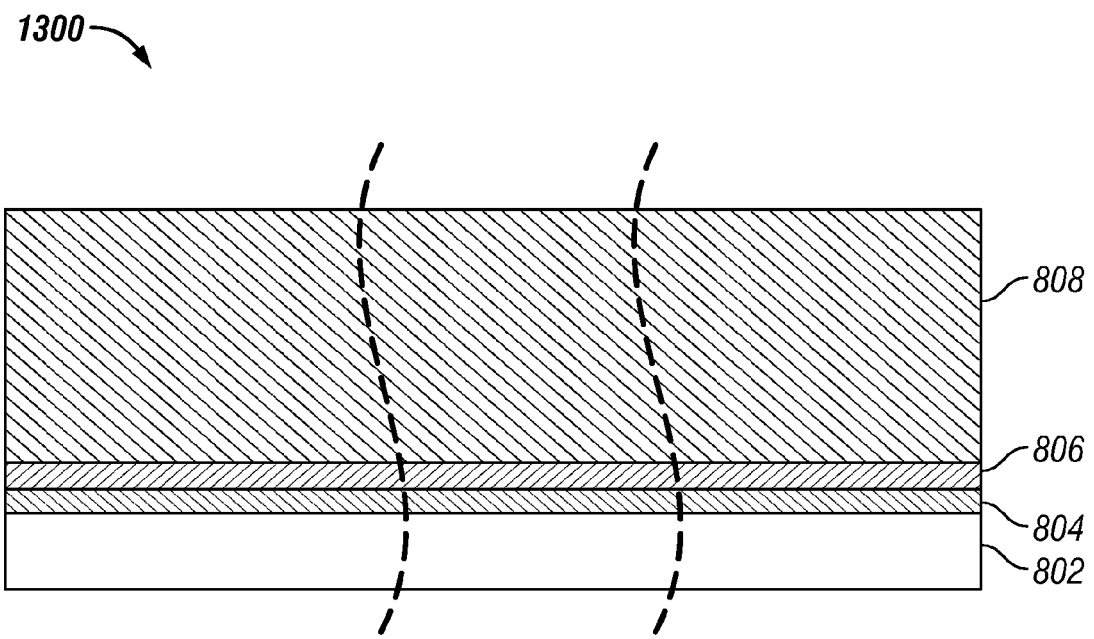
FIGS. 13A-13G are cross sections of an example embodiment of a method of fabricating the MEMS device of FIG. 12A.

FIGS. 13A through 13G illustrate an example embodiment of a method of manufacturing a MEMS device 1200. FIG. 13A illustrates a structure 1300 in which an actuation electrode 804 is formed over a substrate 802. In certain embodiments, forming the actuation electrode 804 comprises forming a plurality of generally parallel portions (e.g., as illustrated in FIG. 9A). As described above, in certain embodiments, an electrically insulating layer 806 may optionally be formed over the actuation electrode 804. The structure 1300 in FIG. 13A further illustrates a support layer 808 formed over the actuation electrode 804, and in embodiments in which the MEMS device 1200 comprises an insulating layer 806, over the insulating layer 806. In certain embodiments, forming the support layer 808 comprises forming a plurality of support structure portions (e.g., as illustrated in FIGS. 10A and 10B).

Figure 13B:
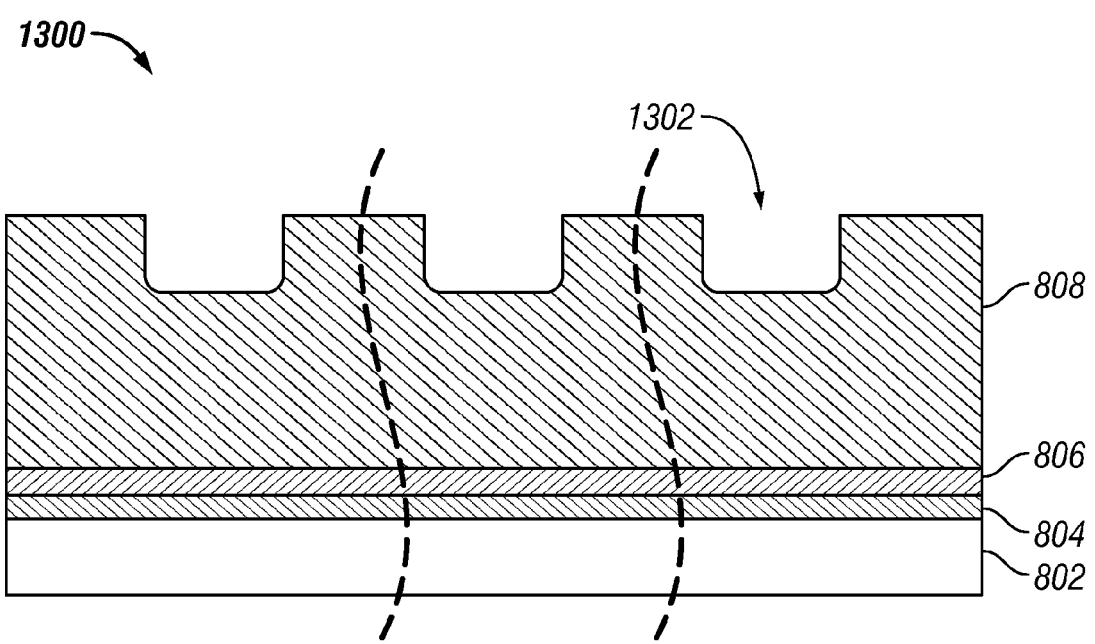

FIG. 13B illustrates the structure 1300 of FIG. 13A after recesses 1302 have been formed in the support layer 808. In certain embodiments, forming the recesses 1302 comprises reactive ion etching. In certain embodiments, forming the recesses 1302 comprises embossing.

Figure 13C:
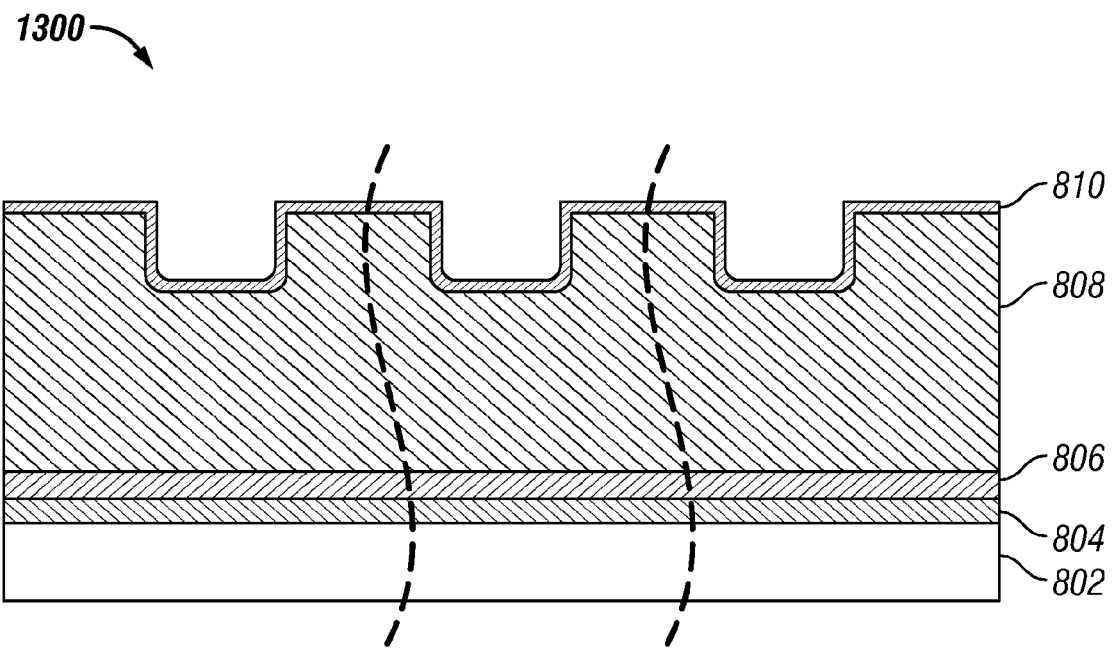
Figure 13D:
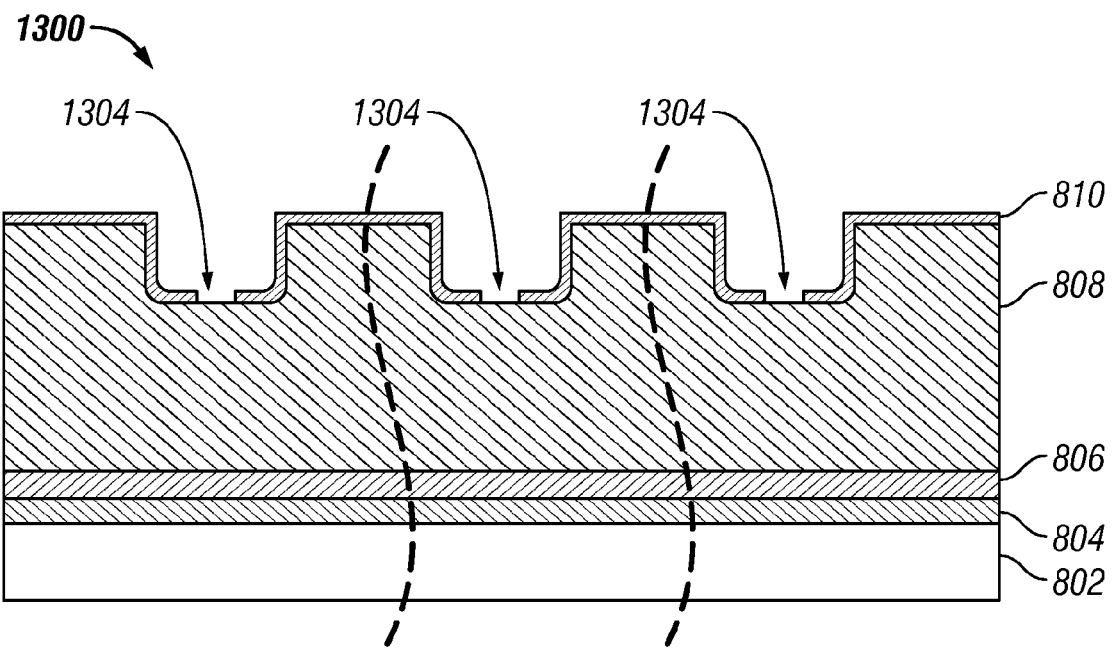

FIG. 13C illustrates the structure 1300 of FIG. 13A after a reflective layer 810 has been formed over the support layer 808. In certain embodiments, forming the reflective layer 810 comprises conformally depositing the material of the reflective layer 810 in the recesses 1302. In certain embodiments, forming the reflective layer 810 comprises forming a plurality of generally parallel portions (e.g., as illustrated in FIG. 9A). As illustrated in FIG. 13C, at least one aperture 1304 is then formed in the reflective layer 810. In certain embodiments, forming the at least one aperture 1304 comprises milling with a focused ion beam (FIB). In certain embodiments, the aperture 1304 is formed using other patterning techniques such as photolithography, lift-off processes, or the like.

Figure 13E:
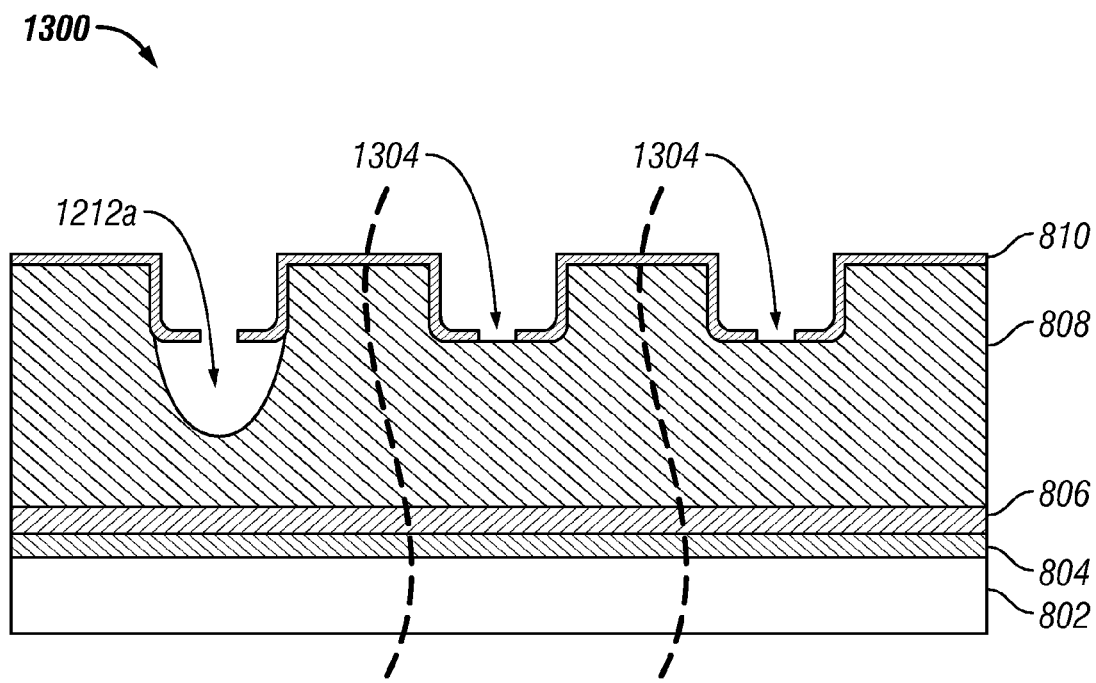

FIG. 13E illustrates the structure 1300 after a first portion 1212a of the support layer 808 is removed while a second portion of the support layer 808 remains. In certain embodiments, the second portion comprises the support layer beneath the other apertures 1304 (e.g., by covering the apertures 1304 with a protective layer) and the support layer 808 between recesses 1212a. In certain embodiments, the protective layer comprises a material (e.g., photoresist) having a viscosity high enough that the material does not substantially penetrate into the recess 1212a through the aperture 1304. In some embodiments, the reflective layer 810 is actuated into the recess 1212a prior to applying the protective layer. In certain embodiments, removing the first portion 1212a of the support layer 808 comprises introducing a reactant to the support layer 808 through the aperture 1304. In the illustrated embodiment, forming the recess in the support layer 808 stops before the first portion 1212a extends through the support layer 808.

Figure 13F:
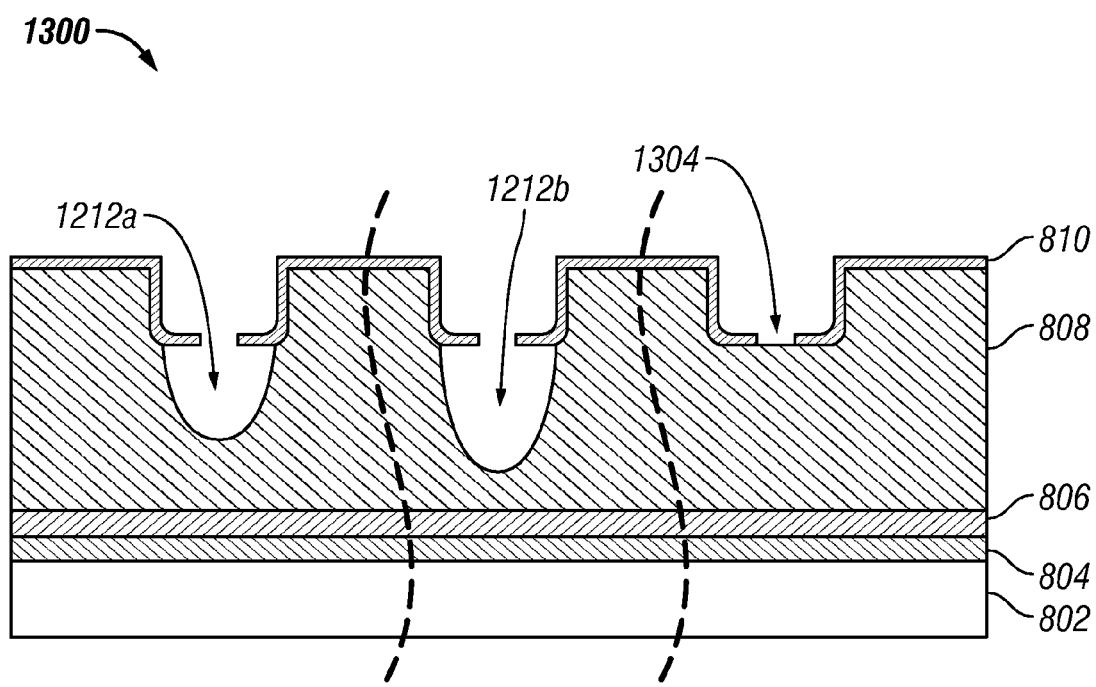

FIG. 13F illustrates the structure 1300 after a first portion 1212b of the support layer 808 is removed while a second portion of the support layer 808 remains. In certain embodiments, the second portion comprises the support layer beneath the aperture 1304 (e.g., by covering the aperture 1304 with a protective layer) and bounding the recess 1212a, and the support layer 808 between recesses 1212b. In certain embodiments, removing the first portion 1212b of the support layer 808 comprises introducing a reactant to the support layer 808 through the aperture 1304. In the illustrated embodiment, forming the recess in the support layer 808 stops before the first portion 1212b extends through the support layer 808.

Figure 13G:
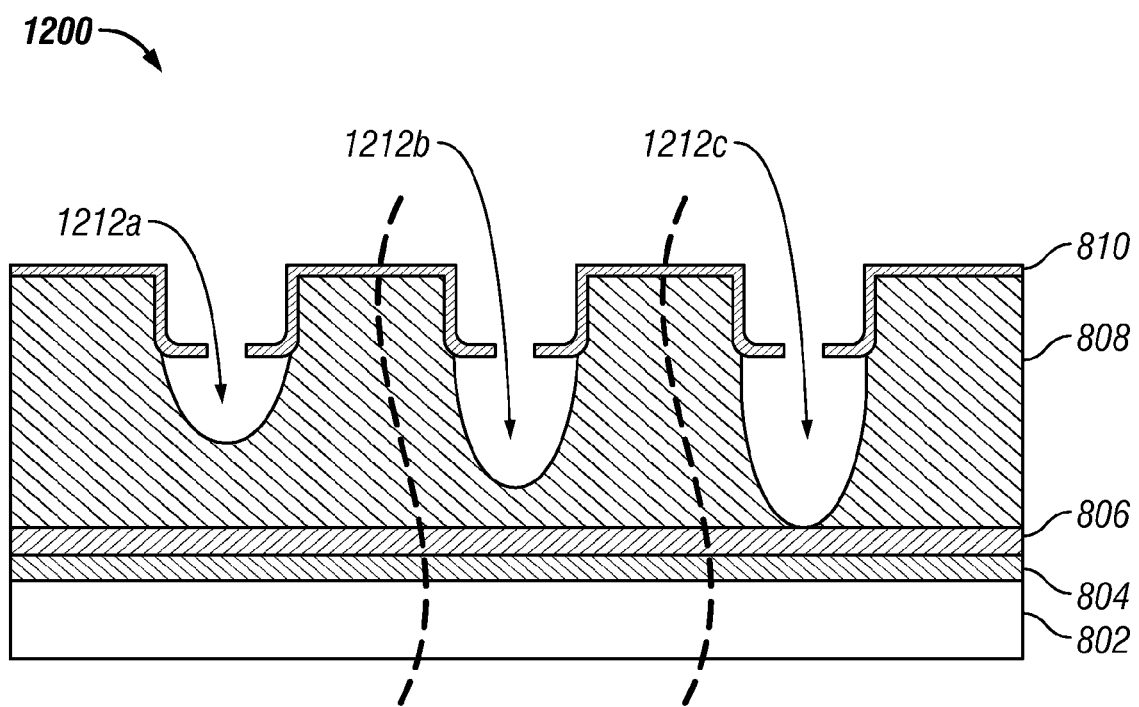

FIG. 13G illustrates the MEMS device 1200 after a first portion 1212c of the support layer 808 is removed while a second portion of the support layer 808 remains. In certain embodiments, the second portion comprises the support layer bounding the recesses 1212a, 1212b, and the support layer 808 between recesses 1212c. In certain embodiments, removing the first portion 1212c of the support layer 808 comprises introducing a reactant to the support layer 808 through the aperture 1304. In certain embodiments, forming the recess in the support layer 808 stops before the first portion 1212c extends through the support layer 808.

Upon completion of the reaction that removes the first portions 1212a, 1212b, 1212c of the support layer 808, the MEMS device 1200 is in an operable state because a control signal may be applied to the actuation electrode 804 that would cause a portion of the reflective layer 810 to move into the removed first portions 1212a, 1212b, 1212c. Accordingly, the MEMS device 1200 is configured to be operated with the second portion of the support layer 808 remaining. It will be appreciated that the structure 1300 of FIGS. 13E and 13F may also be in an operable state because a control signal may be applied to the actuation electrode 804 that would cause a portion of the reflective layer 810 to move into the removed first portion 1212a and/or 1212b.

Other options for manufacturing the MEMS device 1200 are also possible. For example, a first part of the recess 1212c may be removed in a first removal step, a second part of the recess 1212c and a first part of the recess 1212b may be removed in a second removal step, and a third part of the recess 1212c, a second part of the recess 1212b, and the recess 1212a may be removed in a third removal step. As another example, rather than forming the apertures 1304 prior to the removal steps, only the apertures through which a reactant is to be flowed in a subsequent removal step may be formed, thereby reducing or eliminating the need for any protective layers.

Figure 14A:
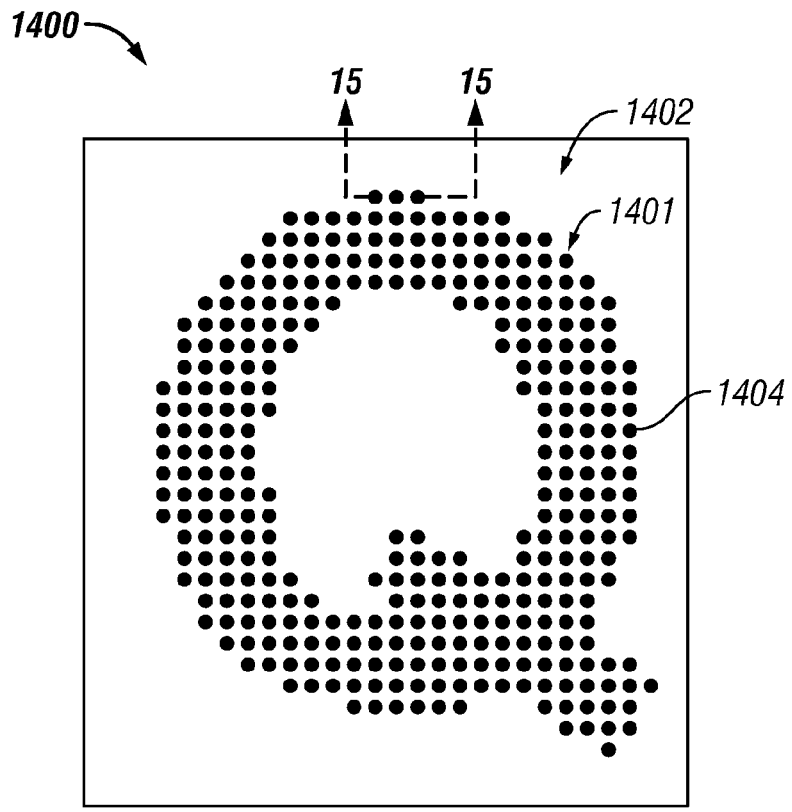
FIGS. 14A and 14B are top plan views of example embodiments of display devices for presenting an image to a viewer.

FIG. 14A illustrates an example embodiment of a display device 1400 for presenting an image to a viewer. The display device 1400 comprises a base layer comprising a first region 1401 comprising a plurality of recesses 1404 in a surface of the base layer. The recesses 1404 have a depth into the surface of the base layer. In certain embodiments, each of the recesses 1404 has a width less than about 1 μm. In some embodiments, each of the recesses 1404 has a width on the order of a wavelength of light. In certain embodiments, the recesses 1404 are distributed in a pattern that is periodic in two dimensions (e.g., as illustrated in FIG. 14A). In certain embodiments, adjacent recesses have a center-to-center distance less than about 2 μm. The display device 1400 further comprises a reflective layer over the base layer. The reflective layer comprises a first portion and a second portion. The first portion is over the first region 1401 and within the plurality of recesses 1404. The second portion is over the first region 1401, but is between the recesses 1404 and not within the plurality of recesses 1404. In some embodiments, a ratio of an area of the first portion to an area of the second portion is about 1:1. In similar fashion to that described above with respect to FIG. 8C, for example, the recesses 1404 cause a phase shift in the light reflected from the first portion of the reflective layer compared to light reflected from the second portion of the reflective layer not in the plurality of recesses 1404. As such, the color of the first region 1401 as perceived by a viewer depends on the depth of the recesses 1404 relative to second portion. In certain embodiments, the base layer further comprises a second region 1402 substantially devoid of recesses. Because the depths of the recesses 1404 create a color due to modulated reflectivity and the second region 1402 does not because it is substantially devoid of recesses, the display device 1405 may create a color contrast between the first region 1401 (e.g., the region shaped like a "Q" in FIG. 14A) and the second region 1402 (e.g., surrounding the "Q" in FIG. 14A).

Figure 14B:
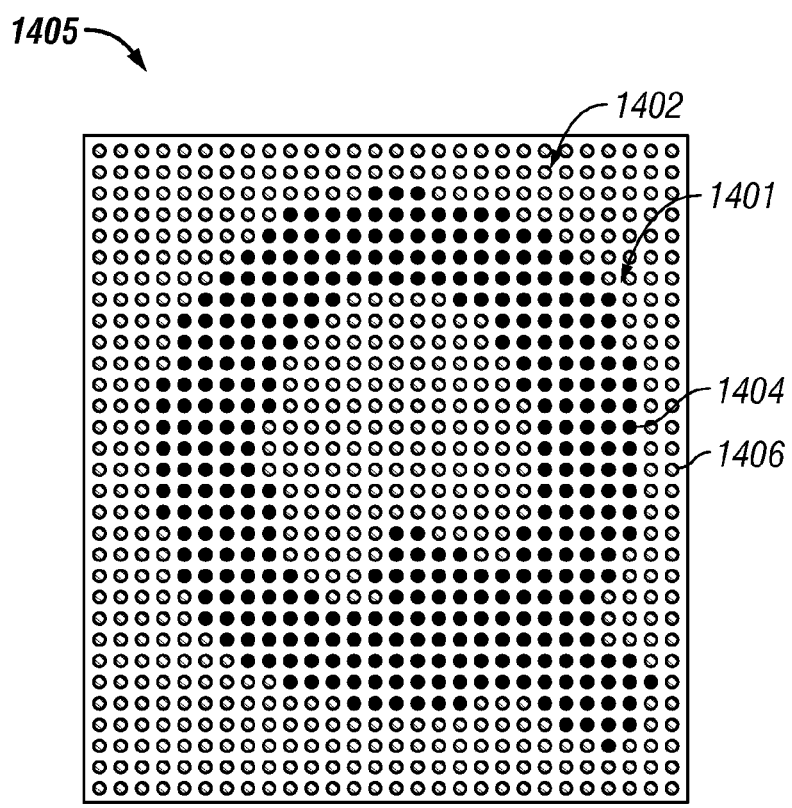

FIG. 14B illustrates another example embodiment of a display device 1405 for presenting an image to a viewer. The display device 1405 comprises the first region 1401 as described above with respect to FIG. 14A. The base layer further comprises a second region 1402 comprising a plurality of second recesses 1406 in the surface of the base layer. The second recesses 1406 have a depth into the surface of the base layer different than the depth of the recesses 1404 of the first portion 1401. In certain embodiments, each of the second recesses 1406 has a width of less than about 1 μm. In some embodiments, each of the second recesses 1406 has a width on the order of a wavelength of light. In certain embodiments, adjacent second recesses 1406 are in a pattern that is periodic in two dimensions (e.g., as illustrated in FIG. 14B). In certain embodiments, adjacent second recesses 1406 have a center-to-center distance of less than about 2 μm. The reflective layer comprises a third portion and a fourth portion. The third portion is over the second region 1402 and within the second recesses 1406. The fourth portion is over the second region 1402, but between the second recesses 1406 and not within the second recesses 1406. In some embodiments, a ratio of an area of the third portion to an area of the fourth portion is about 1:1. The second recesses 1406 cause a phase shift in the light reflected from the third portion of the reflective layer compared to light reflected from the fourth portion of the reflective layer not in the plurality of second recesses 1406. As such, the color of the second region 1402 perceived by a viewer depends on the depth of the second recesses 1406 relative to fourth portion. Because the depths of the recesses 1404 are different than the depths of the second recesses 1406, the display device 1405 may create a color contrast between the first region 1401 (e.g., the region shaped like a "Q" in FIG. 14B) and the second region 1402 (e.g., surrounding the "Q" in FIG. 14B).

Figure 15:
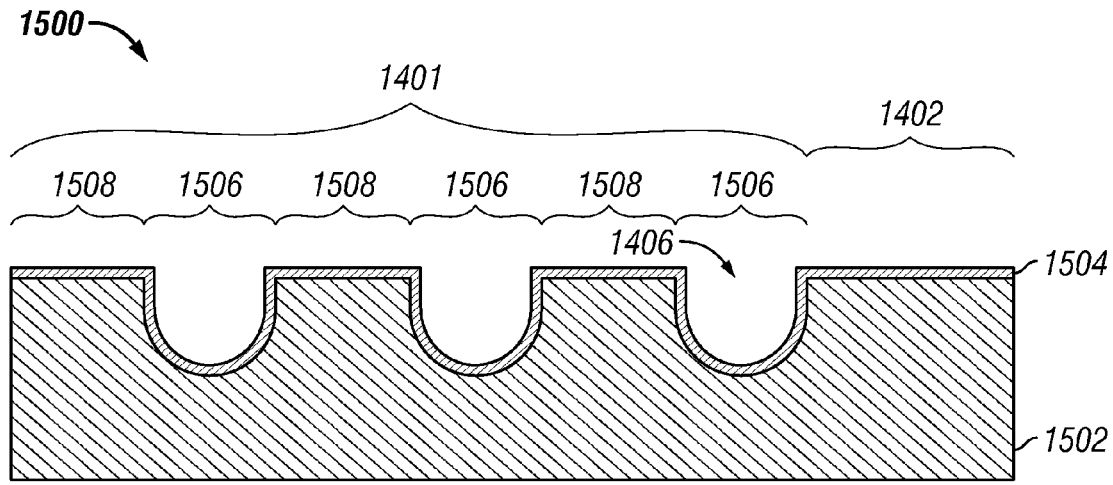
FIG. 15 is a cross sectional view of an example embodiments of a display device taken along the line 15-15 of FIG. 14A.

FIG. 15 illustrates a cross section of an example embodiment of a display device 1500 for presenting a static image to a viewer, for example taken along the line 15-15 of FIG. 14A. The display device 1500 comprises a base layer 1502 and a reflective layer 1504 over the base layer 1502. The base layer 1502 may comprise plastic, glass, metal, a semiconductor, combinations thereof, and the like. The reflective layer 1504 may comprise a reflective metal such as aluminum, copper, silver, combinations thereof, and the like. In certain embodiments, the MEMS device 1500 is flexible, for example if the base layer 1502 comprises a flexible plastic and the reflective layer 1504 comprises a thin layer of flexible metal. The base layer 1502 comprises a first region 1401 comprising a plurality of recesses 1404 in a surface of the base layer 1502. In certain embodiments, each of the recesses 1404 has a width of less than about 1 μm. In some embodiments, each of the recesses 1404 has a width on the order of a wavelength of light. In certain embodiments, adjacent recesses 1404 are in a pattern that is periodic in two dimensions. In certain embodiments, adjacent recesses 1404 have a center-to-center distance less than about 2 μm. The recesses 1404 have a depth into the surface of the base layer 1502. The reflective layer 1504 comprises a first portion 1506 and a second portion 1508. The first portion 1506 is over the first region 1401 and within the recesses 1404. The second portion 1508 is over the first region 1401 but between the recesses 1404 and not within the plurality of recesses 1404. In some embodiments, a ratio of an area of the first portion 1506 to an area of the second portion 1508 is about 1:1.

Figure 16A:
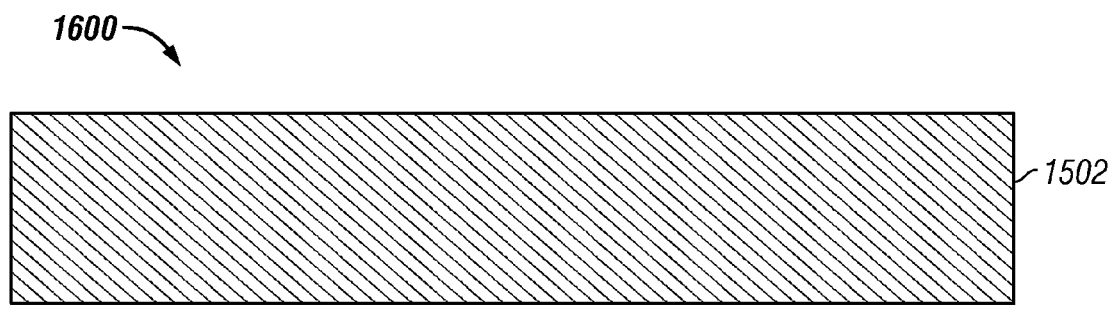
FIGS. 16A-16C are cross sections of an example embodiment of a method of fabricating the display device of FIG. 15.
Figure 16B:
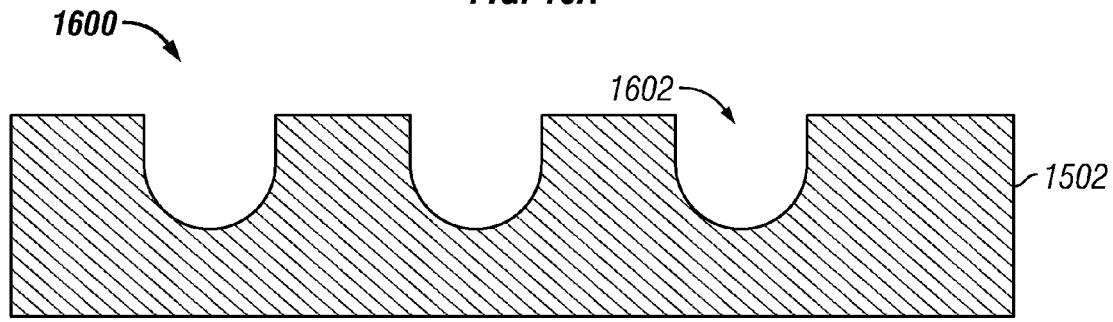
Figure 16C:
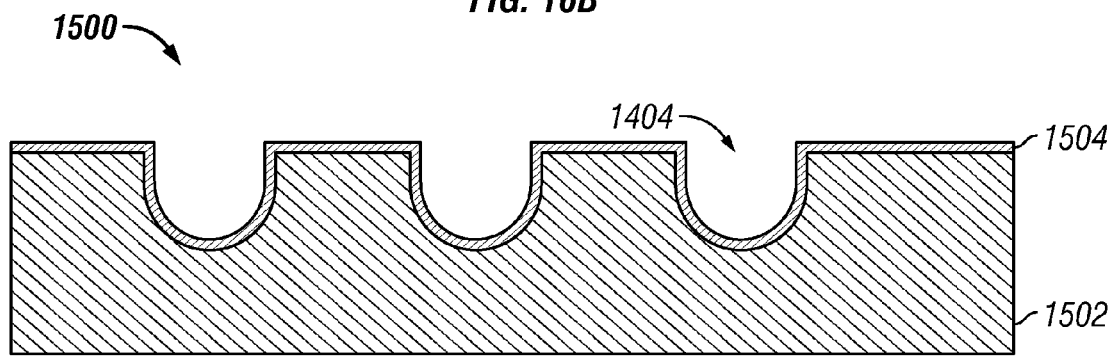

FIGS. 16A through 16C illustrate an example embodiment of a method of manufacturing the display device 1500 of FIG. 15. FIG. 16A illustrates a structure 1600 in which a base layer 1502 has been provided. In some embodiments, providing the base layer 1502 comprises laminating a plurality of layers, preparing the base layer 1502 for subsequent processing, and the like. FIG. 16B illustrates the structure 1600 after a plurality of recesses 1602 has been formed in the base layer 1502. In certain embodiments, each of the recesses 1602 has a width less than 1 μm. In some embodiments, each of the recesses 1602 has a width on the order of a wavelength of light. In certain embodiments, adjacent recesses 1602 are in a pattern that is periodic in two dimensions along the base layer 1502. In certain embodiments, adjacent recesses 1602 have a center-to-center distance less than about 2 μm. In certain embodiments, the recesses 1602 have a depth into the surface of the base layer 1502. In certain embodiments, forming the recesses 1602 in the base layer 1502 comprises embossing. In certain such embodiments, embossing the recesses 1602 in the base layer 1502 comprises forming a die including a negative impression of the plurality of recesses 1602 and imprinting the base layer 1502 with the die. In certain embodiments, forming the recesses 1602 in the base layer 1502 composes reactive ion etching. For example, photolithography and dry etching or direct patterning using a focused ion beam may be used. Other techniques are also possible.

FIG. 16C illustrates the structure 1500 after a layer of reflective material 1504 is deposited over the base layer 1502. In certain embodiments, depositing the layer of reflective layer 1504 comprises sputtering a layer of reflective material 1504 over the base layer 1502. In some embodiments, depositing the layer of reflective layer 1504 comprises plating a layer of reflective material 1504 over the base layer 1502. In certain embodiments, depositing the layer of reflective layer 1504 comprises vapor phase deposition a layer of reflective material 1504 over the base layer 1502. Other deposition methods are also possible.

Figure 17A:
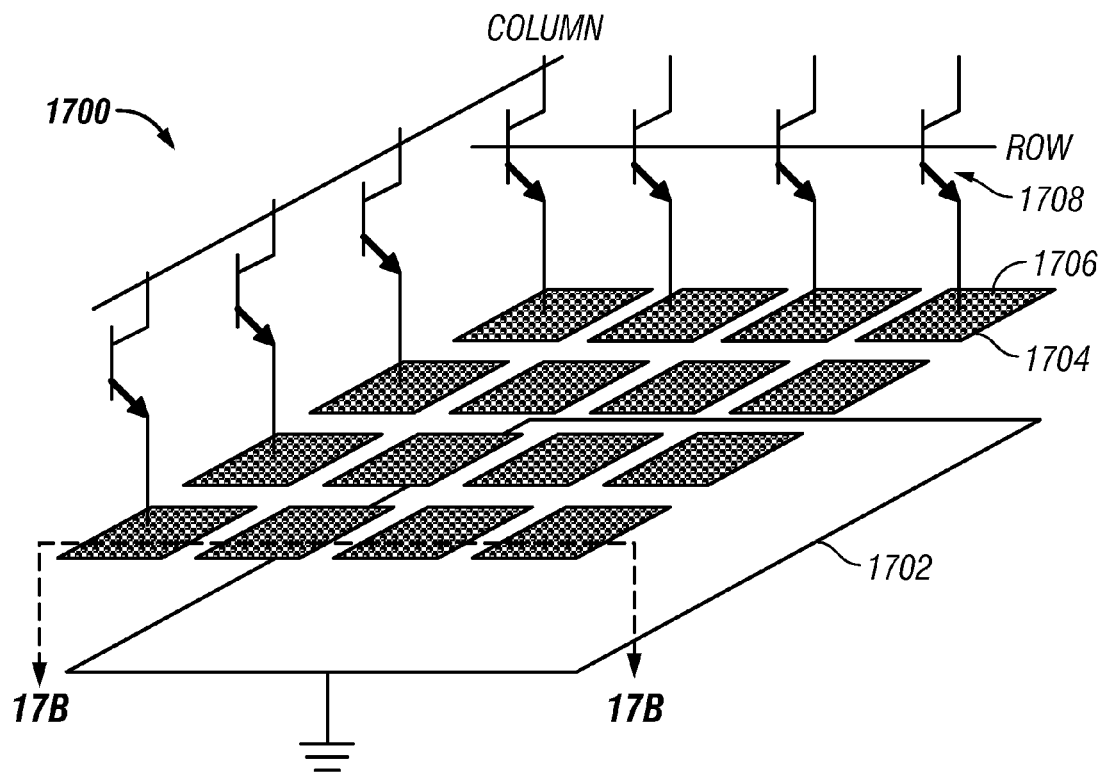
FIG. 17A is a schematic perspective view of a 4×4 array of MEMS devices.

FIG. 17A illustrates an example embodiment of an active matrix display device 1700. The display device 1700 comprises a conventional thin film transistor (TFT) display backplane comprising a plurality of transistors 1708 in which each of the transistor gates on one row are connected together and in which each of the transistor drains on one column are connected together. The display device 1700 further comprises an actuation electrode 1702 and a plurality of pixels 1704. In some embodiments, the actuation electrode 1702 comprises an unpatterned sheet of conductive material. Each of the pixels 1704 includes an electrically isolated reflective layer 1710 (see FIG. 17B) connected to the source of one transistor 1708. To reduce clutter, only some transistors 1708 are illustrated, but it will be appreciated that the reflective layer of each of the pixels 1704 are connected to the source of a transistor 1708. The reflective layer of each pixel comprises a plurality of recesses 1706. Each pixel 1704 may comprise greater than 10, greater than 100, greater than 1,000, or more recesses 1706. The number of recesses 1706 per pixel may depend upon a designed pixel size in the display device 1700 and the size of the recesses 1706 that fit within an area of the pixel.

In a relaxed state, each pixel 1704 reflects broadband white (e.g., as described above with respect to FIG. 8A). In embodiments with fully analog modulation of the reflective layer 1710 of a pixel, upon application of a first control signal (e.g., a small voltage difference between the actuation electrode 1702 and the reflective layer of a pixel 1704), portions of the reflective layer move slightly into the recesses 1706, thereby shifting the modulation to a given color, for example approximating black (e.g., deep violet or near ultraviolet). In certain embodiments, black may also be possible (e.g., in embodiments in which the MEMS device 1700 comprises a partially reflective layer in embodiments in which the reflective layer comprises a stack of layers having different indices of refraction). Upon the application of additional control signals (e.g., higher voltage differences between the actuation electrode 1702 and the reflective layer of a pixel 1704), the movable pixel moves further towards the actuation electrode 1702, thereby shifting the light modulation to other colors. In certain embodiments with quantized states of modulation of the reflective layer 1710 of a pixel, the application of a second control signal causes the pixel 1704 to move such that the pixel reflects blue, the application of a third control signal causes the pixel 1704 to move such that the pixel reflects green, and the application of a fourth control signal causes the pixel 1704 to move such that the pixel reflects red. In some embodiments, the first control signal comprises a small voltage difference, the second control signal comprises a higher voltage difference, the third control signal comprises a yet higher voltage difference, and the fourth control signal comprises a still higher voltage difference.

Figure 17B:
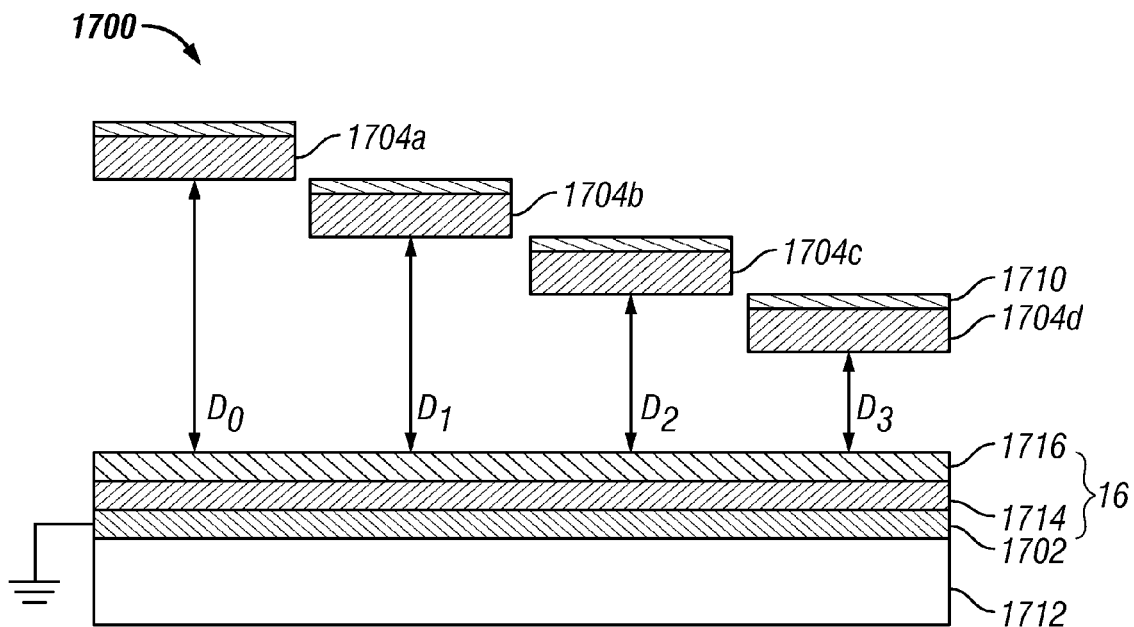
FIG. 17B is a cross section of an example embodiment of a plurality of MEMS devices taken along line 17B-17B of FIG. 17A.

FIG. 17B is a cross section of an example embodiment of the display device 1700 of FIG. 17A taken along the line 17B-17B. Each of the pixels 1704*a*, 1704*b*, 1704*c*, 1704*c* are illustrated as being in a different state of actuation. The pixel 1704*a* is either in a relaxed state or is under the influence of the first control signal. In certain embodiments, the pixel 1704*a* reflects white in the relaxed state. In certain embodiments, the pixel 1704*a* reflects a color approximating black (e.g., deep violet or near ultraviolet) when under the influence of a first control signal. In certain embodiments, black may also be possible (e.g., in embodiments in which the MEMS device 1700 comprises a partially reflective layer in embodiments in which the reflective layer comprises a stack of layers having different indices of refraction. The pixel 1704*a* is spaced from the optical stack 16 by a distance $D_0$. The pixel 1704*b* is under the influence of the second control signal, in which the pixel 1704*b* is moves towards the actuation electrode 1702 until the pixel 1704*b* is spaced from the optical stack 16 by a distance $D_1$. In some embodiments, the pixel 1704*b* reflects blue under the influence of the second control signal. The pixel 1704*c* is under the influence of the third control signal, in which the pixel 1704*c* is moves towards the actuation electrode 1702 until the pixel 1704*c* is spaced from the optical stack 16 by a distance $D_2$. In some embodiments, the pixel 1704*c* reflects green under the influence of the third control signal. The pixel 1704*d* is under the influence of the fourth control signal, in which the pixel 1704*d* is moves towards the actuation electrode 1702 until the pixel 1704*d* is spaced from the optical stack 16 by a distance $D_3$. In some embodiments, the pixel 1704*d* reflects red under the influence of the fourth control signal. In certain embodiments, cycling of the pixel 1704 between each of the colors may be used to create colors such as cyan (e.g., by cycling the pixel between blue and green). Other color combinations are also possible.

Although this invention has been disclosed in the context of certain preferred embodiments and examples, it will be understood by those skilled in the art that the present invention extends beyond the specifically disclosed embodiments to other alternative embodiments and/or uses of the invention and obvious modifications and equivalents thereof. In addition, while several variations of the invention have been shown and described in detail, other modifications, which are within the scope of this invention, will be readily apparent to those of skill in the art based upon this disclosure. It is also contemplated that various combinations or sub-combinations of the specific features and aspects of the embodiments may be made and still fall within the scope of the invention. It should be understood that various features and aspects of the disclosed embodiments can be combined with, or substituted for, one another in order to form varying modes of the disclosed invention. Thus, it is intended that the scope of the present invention herein disclosed should not be limited by the particular disclosed embodiments described above, but should be determined only by a fair reading of the claims that follow.

What is claimed is:

1. A microelectromechanical (MEMS) device comprising:
 a substrate;
 an actuation electrode over the substrate;
 a reflective layer over the actuation electrode, the reflective layer including a plurality of apertures through the reflective layer and inwardly spaced from a lateral edge of the reflective layer; and
 a support layer between the actuation electrode and the reflective layer, the support layer including a recess below each of the plurality of apertures and between the actuation electrode and the plurality of apertures, wherein the recesses are in a pattern that is periodic in two dimensions along the support layer, wherein upon application of a control signal to the device, at least a first portion of the reflective layer is configured to move into the each of the recesses and at least a second portion of the reflective layer is configured to remain stationary, the first portion of the reflective layer comprising the plurality of apertures, wherein the reflectivity of the MEMS device is dominantly modulated by changing a phase difference between light reflected from the first portion and light reflected from the second portion.

2. The MEMS device of claim 1, wherein the control signal comprises a voltage difference between the actuation electrode and the reflective layer.

3. The MEMS device of claim 1, wherein a ratio of an area of the first portion to an area of the second portion is about 1:1.

4. The MEMS device of claim 1, wherein adjacent said recesses have a center-to-center distance less than about 2 μm.

5. The MEMS device of claim 1, wherein adjacent said recesses have an edge-to-edge distance less than about 1 μm.

6. The MEMS device of claim 1, wherein the reflective layer comprises a plurality of generally parallel portions extending along a first direction across the device and wherein the actuation electrode comprises a plurality of generally parallel portions extending along a second direction across the device, the first direction substantially non-parallel to the second direction, wherein areas of overlap between the generally parallel portions of the reflective layer and the generally parallel portions of the actuation electrode comprise pixels.

7. The MEMS device of claim 6, wherein the generally parallel portions of the reflective layer comprise stripes and wherein the generally parallel portions of the actuation electrode comprise stripes.

8. The MEMS device of claim 6, wherein the first direction is substantially perpendicular to the second direction.

9. The MEMS device of claim 6, wherein the support layer has a first thickness under a first said generally parallel portion of the reflective layer, a second thickness under a second said generally parallel portion of the reflective layer, and a third thickness under a third said generally parallel portion of the reflective layer, wherein the first, second, and third thicknesses are different from each other.

10. The MEMS device of claim 9, wherein a difference in thickness between the first thickness and the second thickness is greater than a thickness of the first generally parallel portion of the reflective layer and wherein a difference in thickness between the second thickness and the third thickness is greater than a thickness of the second generally parallel portion of the reflective layer.

11. The MEMS device of claim 1, wherein a width of each of the plurality of apertures in the reflective layer is between about 10 and 300 nm.

12. The MEMS device of claim 1, wherein a width of each of the recesses in the support layer is less than about 1 μm.

13. The MEMS device of claim 1, wherein a ratio of a width of each of the plurality of apertures in the reflective layer to a width of the recess below said aperture in the support layer is less than about 1:3.

14. The MEMS device of claim 1, wherein the support layer has a thickness between about 100 and 150 nm.

15. The MEMS device of claim 1, wherein each of the recesses is at least partially bounded by a substantially flat surface.

16. The MEMS device of claim 1, wherein the reflectivity of the MEMS device is changeable between a zero phase difference and a non-zero phase difference.

17. The MEMS device of claim 1, wherein the substrate is at least partially transparent, wherein the actuation electrode is at least partially transparent, and wherein the support layer is at least partially transparent.

18. The MEMS device of claim 1, wherein the MEMS device is operably viewable through the actuation electrode and from a side of the reflective layer opposite the actuation electrode.

19. The MEMS device of claim 1, wherein the support layer comprises photoresist.

20. The MEMS device of claim 1, wherein the substrate comprises metal.

21. The MEMS device of claim 1, wherein each of the recesses extends through the support layer.

22. The MEMS device of claim 1, further comprising an electrically insulating layer between the actuation electrode and the support layer.

23. The MEMS device of claim 1, further comprising:
a display;
a processor that is configured to communicate with the display, the processor configured to process image data; and
a memory device configured to communicate with the processor.

24. The MEMS device of claim 23, further comprising a driver circuit configured to send at least one signal to the display.

25. The MEMS device of claim 24, further comprising a controller configured to send at least a portion of the image data to the driver circuit.

26. The MEMS device of claim 23, further comprising an image source module configured to send said image data to said processor.

27. The MEMS device of claim 26, wherein the image source module comprises at least one of a receiver, transceiver, and transmitter.

28. The MEMS device of claim 23, further comprising an input device configured to receive input data and to communicate said input data to said processor.

29. The MEMS device of claim 1, wherein each of the plurality of apertures has a generally circular cross-section through a plane parallel to the reflective layer.

30. The MEMS device of claim 1, wherein each of the recesses has a generally circular cross-section through a plane parallel to the support layer.

31. The MEMS device of claim 1, wherein the reflective layer is substantially continuous across the device.

32. The MEMS device of claim 1, wherein the recesses are isolated from each other by the support layer.

33. A microelectromechanical (MEMS) device comprising:
an actuation electrode;
a reflective layer over the actuation electrode, the reflective layer including at least one aperture through the reflective layer, wherein the at least one aperture has a generally circular cross-section through a plane parallel to the reflective layer; and
a support layer between the actuation electrode and the reflective layer, the support layer including a recess under the at least one aperture, wherein upon application of a control signal to the device, at least a first portion of the reflective layer is configured to move into the recess and at least a second portion of the reflective layer is configured to remain stationary, the first portion comprising the at least one aperture, wherein the reflectivity of the MEMS device is dominantly modulated by changing a phase difference between light reflected from the first portion and light reflected from the second portion.

34. The MEMS device of claim 33, wherein the recess has a generally circular cross-section through a plane parallel to the support layer.

35. The MEMS device of claim 33, wherein the reflective layer includes a plurality of apertures through the reflective layer and wherein the support layer includes a recess below each of the plurality of apertures, wherein upon application of the control signal, the first portion of the reflective layer is configured to move into the recesses and the second portion of the reflective layer is configured to remain stationary, the first portion comprising the plurality of apertures.

36. A microelectromechanical (MEMS) device comprising:
an actuation electrode;
a reflective layer over the actuation electrode, the reflective layer including at least one generally circular aperture through the reflective layer; and
a support layer between the actuation electrode and the reflective layer, the support layer including a generally circular recess positioned under the at least one aperture, a diameter of the at least one aperture is smaller than a diameter of the recess, wherein upon application of a control signal to the device, at least a first portion of the reflective layer is configured to move into the recess and at least a second portion of the reflective layer is configured to remain stationary, wherein the reflectivity of the MEMS device is dominantly modulated by changing a phase difference between light reflected from the first portion and light reflected from the second portion.

37. The MEMS device of claim 36, wherein the reflective layer includes a plurality of generally circular apertures through the reflective layer and wherein the support layer includes a generally circular recess below each of the plurality of apertures, wherein upon application of the control signal, the first portion of the reflective layer is configured to move into the recesses and the second portion of the reflective layer is configured to remain stationary, the first portion comprising the plurality of apertures.

* * * * *

UNITED STATES PATENT AND TRADEMARK OFFICE
CERTIFICATE OF CORRECTION

PATENT NO. : 7,773,286 B2  
APPLICATION NO. : 11/949612  
DATED : August 10, 2010  
INVENTOR(S) : Marc Maurice Mignard Page 1 of 1

It is certified that error appears in the above-identified patent and that said Letters Patent is hereby corrected as shown below:

On the Title Page at Item (56), Column 2, Line 13, under Other Publications, change "Liquivista" to --Liquavista--.

On the Title Page at Item (56), Page 3, Column 2, Line 15, under Foreign Patent Documents, change "JP 2002-062490 2/2000" to --JP 2002-062490 2/2002--.

At Column 18, Line 19, change "la" to --$\tau_a$--.

At Column 20, Line 49, change "an" to --in--.

Signed and Sealed this  
Twenty-fifth Day of January, 2011

David J. Kappos  
*Director of the United States Patent and Trademark Office*